（12） United States Patent
Toda

(10) Patent No.: US 11,221,256 B2
(45) Date of Patent: Jan. 11, 2022

(54) SENSOR, SOLID-STATE IMAGING APPARATUS, AND ELECTRONIC APPARATUS

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 100 days.

(21) Appl. No.: 16/485,540

(22) PCT Filed: Jan. 18, 2018

(86) PCT No.: PCT/JP2018/001422
§ 371 (c)(1),
(2) Date: Aug. 13, 2019

(87) PCT Pub. No.: WO2018/150801
PCT Pub. Date: Aug. 23, 2018

(65) Prior Publication Data
US 2020/0386620 A1 Dec. 10, 2020

(30) Foreign Application Priority Data
Feb. 20, 2017 (JP) .............................. JP2017-029107

(51) Int. Cl.
G01J 3/26 (2006.01)
G02B 5/28 (2006.01)
G01J 3/28 (2006.01)

(52) U.S. Cl.
CPC ................. *G01J 3/26* (2013.01); *G02B 5/28* (2013.01); *G01J 2003/2826* (2013.01)

(58) Field of Classification Search
CPC ........ G01J 3/26; G01J 2003/2826; G02B 5/28
See application file for complete search history.

(56) References Cited

U.S. PATENT DOCUMENTS

2010/0013907 A1    1/2010  Lee
2011/0155893 A1*   6/2011  Endo ................. H01L 27/14612
                                                        250/208.1
(Continued)

FOREIGN PATENT DOCUMENTS

CN    101213669 A    7/2008
CN    102668081 A    9/2012
(Continued)

OTHER PUBLICATIONS

International Search Report and Written Opinion of PCT Application No. PCT/JP2018/001422, dated Apr. 17, 2018, 09 pages of ISRWO.

*Primary Examiner* — Jamil Ahmed
(74) *Attorney, Agent, or Firm* — Chip Law Group

(57) ABSTRACT

To provide a sensor that can improve reliability and image quality. Provided is a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; and at least one photoelectric conversion element. The distance of the gap is changed to acquire continuous optical spectra.

15 Claims, 20 Drawing Sheets

(56) References Cited

U.S. PATENT DOCUMENTS

| | | | |
|---|---|---|---|
| 2015/0138561 A1 | 5/2015 | Sano et al. | |
| 2015/0153564 A1 | 6/2015 | Sano et al. | |
| 2015/0185074 A1 | 7/2015 | Zhao et al. | |
| 2015/0241279 A1* | 8/2015 | Funamoto | G01J 3/26 356/326 |
| 2015/0253478 A1* | 9/2015 | Aube | G02C 7/107 359/589 |
| 2017/0243988 A1* | 8/2017 | Bower | H01L 31/02165 |

FOREIGN PATENT DOCUMENTS

| | | | |
|---|---|---|---|
| CN | 104678473 A | 6/2015 | |
| CN | 104749765 A | 7/2015 | |
| CN | 104869371 A | 8/2015 | |
| EP | 1900031 A1 | 3/2008 | |
| EP | 2518768 A1 | 10/2012 | |
| JP | 2008-544571 A | 12/2008 | |
| JP | 2015-099074 A | 5/2015 | |
| JP | 2015-106107 A | 6/2015 | |
| JP | 2015-125082 A | 7/2015 | |
| JP | 2015-161512 A | 9/2015 | |
| JP | 2016-211860 A | 12/2016 | |
| KR | 10-2007-0000578 A | 1/2007 | |
| KR | 10-2012-0097401 A | 9/2012 | |
| TW | 201643390 A | 12/2016 | |
| WO | 2007/001146 A1 | 1/2007 | |
| WO | 2011/077580 A1 | 6/2011 | |
| WO | 2016/175089 A1 | 11/2016 | |

\* cited by examiner

| PEAK WAVELENGTH $\lambda_0$(nm) | GAP DISTANCE d (nm) |
|---|---|
| 504 | 250 |
| 582 | 320 |
| 661 | 400 |

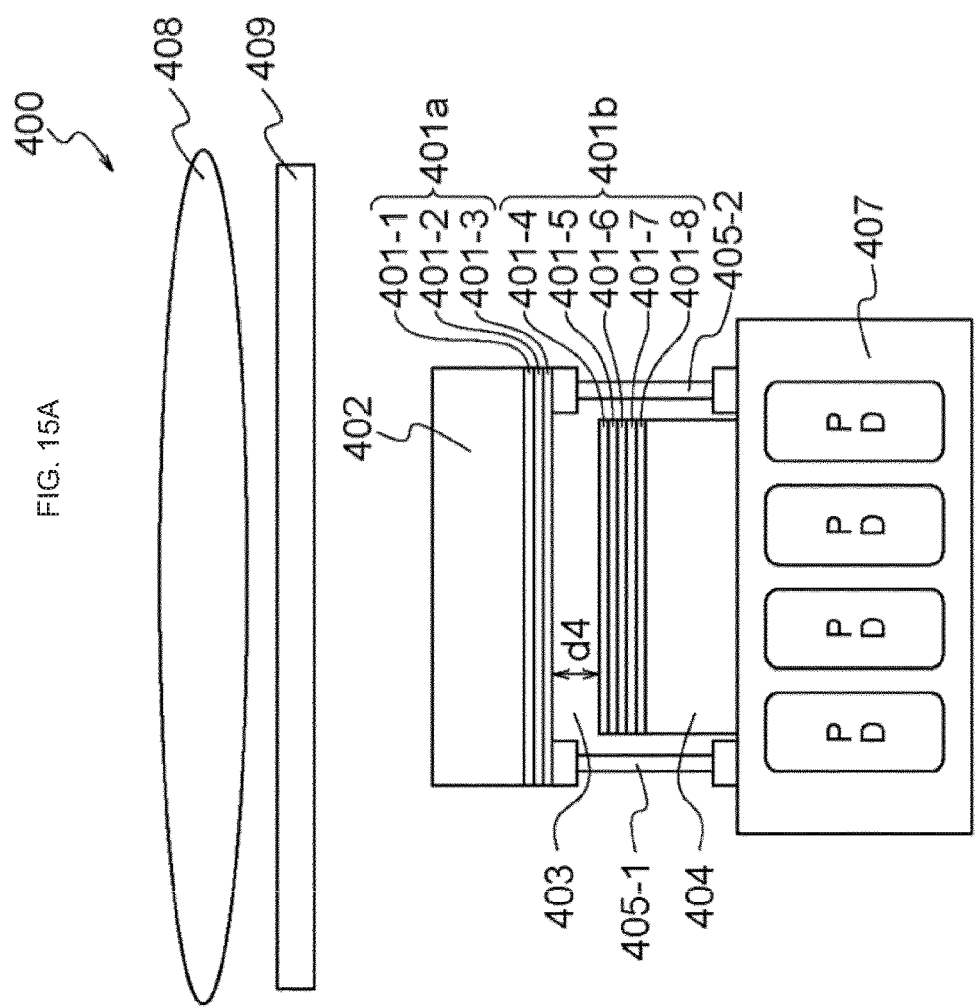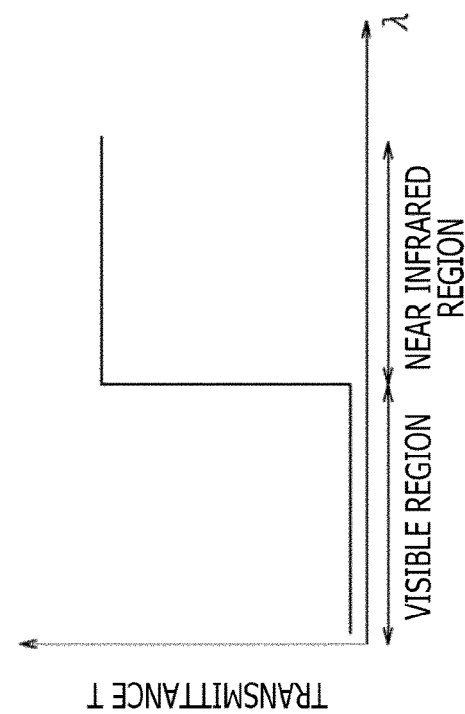

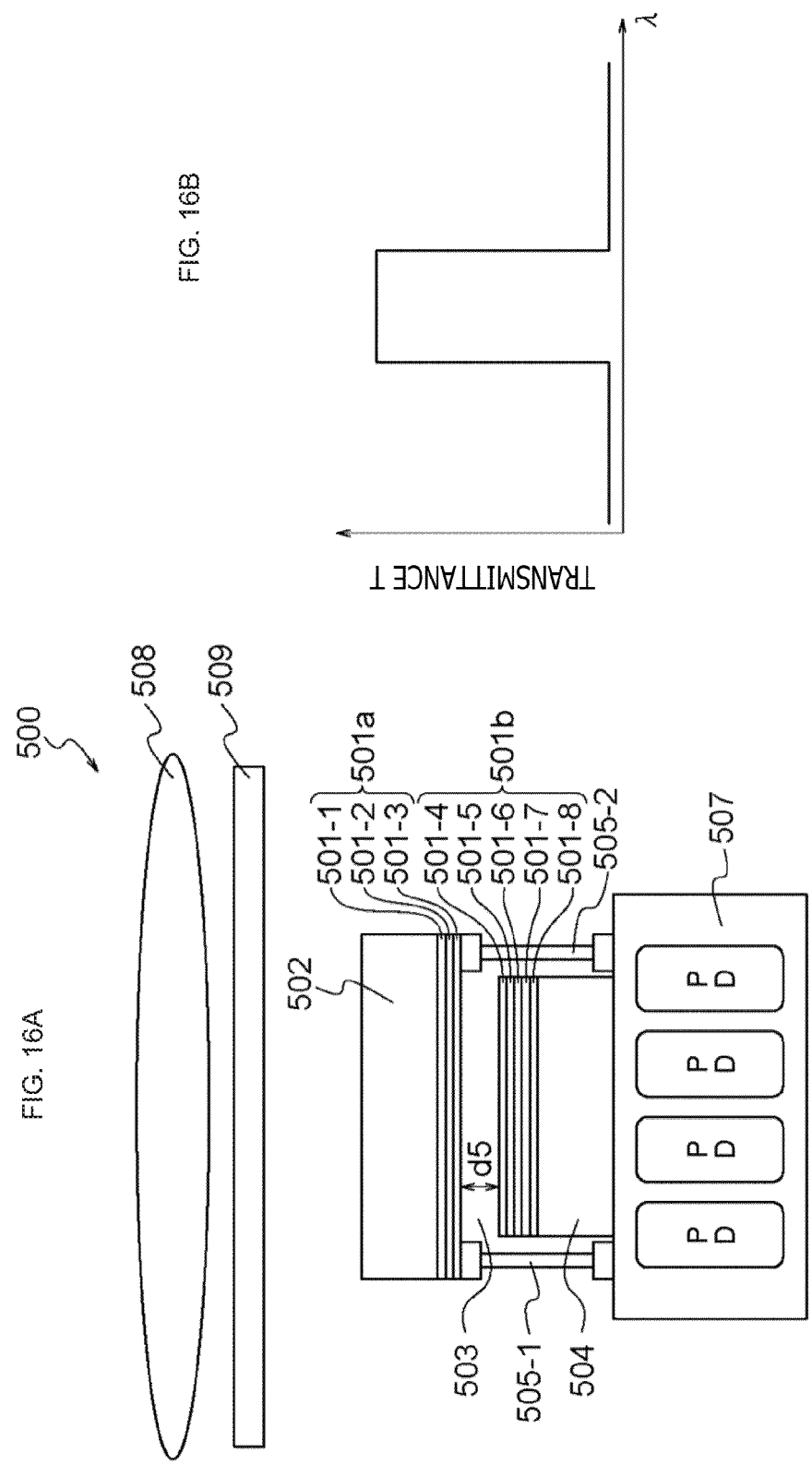

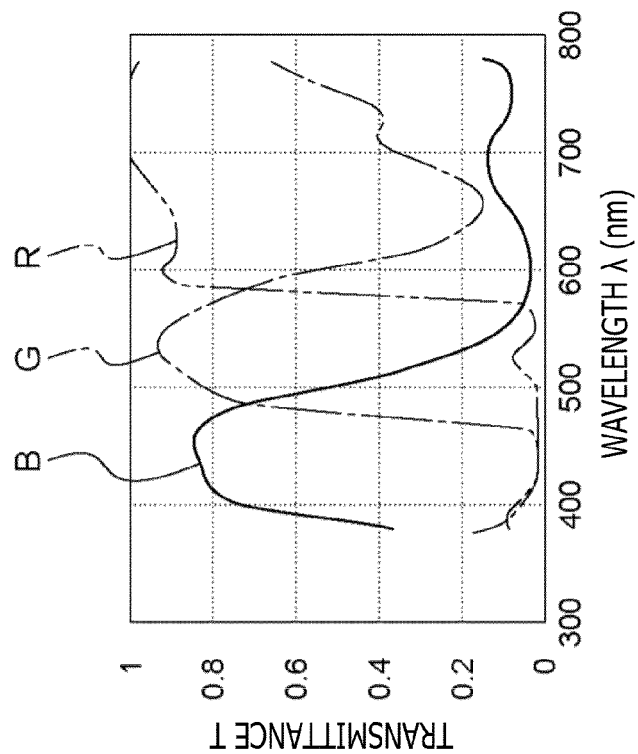
FIG. 17C
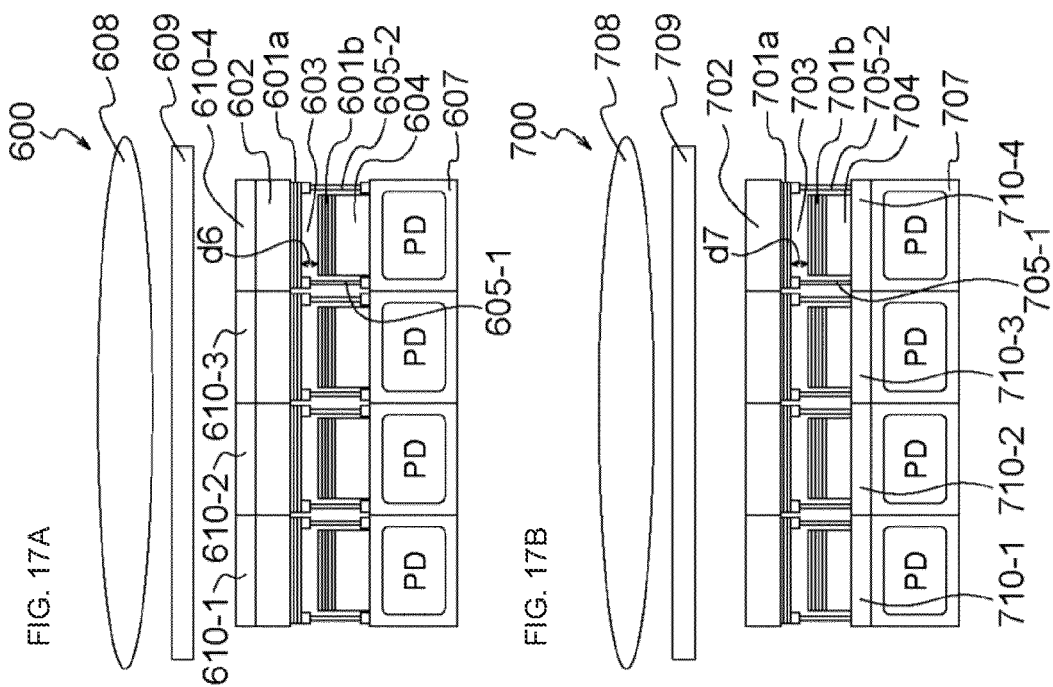
FIG. 17A
FIG. 17B

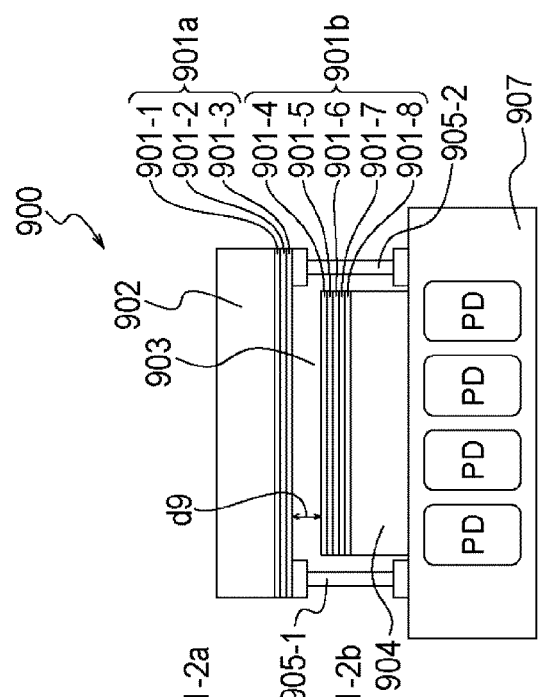
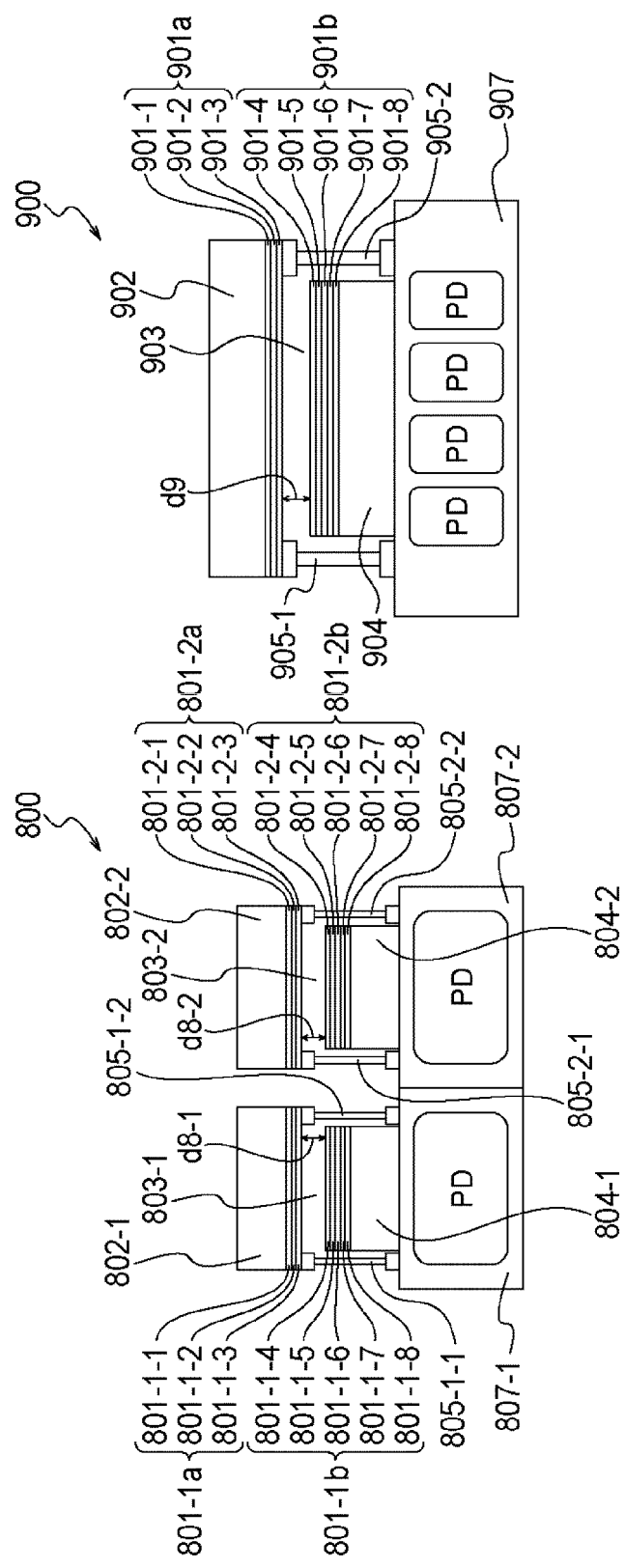

SENSOR, SOLID-STATE IMAGING APPARATUS, AND ELECTRONIC APPARATUS

CROSS REFERENCE TO RELATED APPLICATIONS

This application is a U.S. National Phase of International Patent Application No. PCT/JP2018/001422 filed on Jan. 18, 2018, which claims priority benefit of Japanese Patent Application No. JP 2017-029107 filed in the Japan Patent Office on Feb. 20, 2017. Each of the above-referenced applications is hereby incorporated herein by reference in its entirety.

TECHNICAL FIELD

The present technique relates to a sensor, a solid-state imaging element, and an electronic apparatus.

BACKGROUND ART

In recent years, various types of research and development are conducted to improve the image quality in a field regarding a solid-state imaging apparatus, such as a CMOS (Complementary Metal Oxide Semiconductor) image sensor (CIS) and a CCD (Charge Coupled Device), in optoelectronics in general.

For example, an imaging apparatus is proposed, the imaging apparatus including an image sensor provided with a plurality of unit pixels on a chip. The image sensor includes: a photoelectric conversion element that photoelectrically converts incident light on the basis of the unit pixels; and a filter arranged on an upper part of the photoelectric conversion element and configured to selectively transmit only part of wavelengths of the incident light to separate color components. The filter is a multilayer film filter including an inorganic material, and a half-width of a band of the selective transmission is narrower than 100 nm (see PTL 1).

In addition, for example, a variable spectral transmittance element is proposed, the variable spectral transmittance element arranged on an optical path of an optical system including an imaging element. The variable spectral transmittance element includes: a plurality of sets of small reflective mirrors facing each other arranged in parallel on substantially the same plane perpendicular to an optical axis, the small reflective mirrors having an effective diameter in a size that allows to pass a luminous flux received by part of light receiving regions on the basis of a pixel or a plurality of pixels of the imaging element; and variable internal means capable of changing intervals between the sets of small reflective mirrors facing each other (see PTL 2).

CITATION LIST

Patent Literature

[PTL 1]
 JP 2007-103401A
[PTL 2]
 JP 2006-178320A

SUMMARY

Technical Problem

However, the techniques proposed in PTL 1 and PTL 2 may not be able to further improve the reliability or improve the image quality. Therefore, a sensor and a solid-state imaging apparatus with further improvement in reliability and image quality are currently desired.

Thus, the present technique has been made in view of such circumstances, and a main object of the present technique is to provide a sensor, a solid-state imaging apparatus, and an electronic apparatus including the sensor or the solid-state imaging apparatus with improved reliability and image quality.

Solution to Problem

As a result of intensive studies for solving the object, the present inventor has succeeded in developing a sensor and a solid-state imaging apparatus with improved reliability and image quality and has completed the present technique.

That is, the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; and at least one photoelectric conversion element. The distance of the gap is changed to acquire continuous optical spectra.

In addition, the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; a first semiconductor substrate; a second semiconductor substrate; at least one photodiode formed on the first semiconductor substrate, the photodiode including a light receiving surface on a second main surface side of the first semiconductor substrate; a floating diffusion formed on a surface of a first main surface of the first semiconductor substrate; a first transistor formed on the first main surface of the first semiconductor substrate; a first wiring layer formed on the first main surface of the first semiconductor substrate; a first electrode exposed on a surface of the first wiring layer; a second transistor formed on a first main surface of the second semiconductor substrate; a second wiring layer formed on the first main surface of the second semiconductor substrate; a second electrode exposed on a surface of the second wiring layer; and a floating diffusion wire that connects the floating diffusion and a gate electrode of the second transistor through the first electrode and the second electrode. The first electrode and the second electrode are joined, the first semiconductor substrate and the second semiconductor substrate are pasted together, and the distance of the gap is changed to acquire continuous optical spectra. The second transistor may be shared by the at least one photodiode.

Furthermore, the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; a first semiconductor substrate; a second semiconductor substrate; at least one photodiode formed on the first semiconductor substrate, the photodiode including a light receiving surface on a second main surface side of the first semiconductor substrate; a first transistor formed on the first main surface of the first semiconductor substrate; a first wiring layer formed on the first main surface of the first semiconductor substrate; a first electrode exposed on a surface of the first wiring layer; a second transistor formed on a first main surface of the second semiconductor substrate; a second wiring layer formed on the first main surface of the second semiconductor substrate; a second electrode exposed on a surface of the second wiring layer; and a current reading wire that connects a third electrode of the at least one photodiode and a gate electrode of the second transistor through the first electrode and the second electrode. The first electrode and the second electrode are joined, the first semiconductor substrate and the second semiconductor substrate are pasted together, and the distance of the gap is changed to acquire continuous optical spectra. The second transistor may be shared by the at least one photodiode.

In the continuous optical spectra, a peak wavelength interval of at least one set of two spectra adjacent to each other may be equal to or smaller than a peak half-width.

The optical element may be a Fabry-Perot resonator.

The gap may be an air gap.

The variable distance apparatus may be a piezoelectric device or a MEMS device.

In the sensor according to the present technique, a light charge signal may be continuously read in conjunction with the change in the distance of the gap.

In the sensor according to the present technique, a light charge signal may be continuously read through a current in conjunction with the change in the distance of the gap.

The sensor according to the present technique may further include at least one filter that transmits light in a specific wavelength band in incident light.

The present technique provides a solid-state imaging apparatus including at least one sensor according to the present technique. A plurality of pixels is one-dimensionally or two-dimensionally arranged.

In addition, the present technique provides an electronic apparatus including the sensor according to the present technique.

Furthermore, the present technique provides an electronic apparatus including the solid-state imaging apparatus according to the present technique.

Advantageous Effect of Invention

According to the present technique, the reliability and the image quality can be improved. Note that the advantageous effect described here may not be limited, and the advantageous effect may be any of the advantageous effects described in the present technique.

BRIEF DESCRIPTION OF DRAWINGS

FIGS. 15A and 15B are diagrams illustrating a cross-sectional configuration of a solid-state imaging apparatus of Example 2 according to the present technique and is a diagram illustrating a relationship between the transmittance (T) and the wavelength (A) when light enters the solid-state imaging apparatus of Example 2.

FIGS. 16A and 16B are diagrams illustrating a cross-sectional configuration of a solid-state imaging apparatus of Example 3 according to the present technique and is a diagram illustrating a relationship between the transmittance (T) and the wavelength (A) when light enters the solid-state imaging apparatus of Example 3.

FIGS. 17A, 17B, and 17C are diagrams illustrating a cross-sectional configuration of a solid-state imaging apparatus of Example 4 according to the present technique and is a diagram illustrating a relationship between the transmittance (T) and the wavelength (A) of on-chip color filters (OCCF).

FIGS. 18A and 18B are diagrams illustrating a cross-sectional configuration of a solid-state imaging apparatus of Example 5 according to the present technique.

DESCRIPTION OF EMBODIMENTS

Figure 1A:
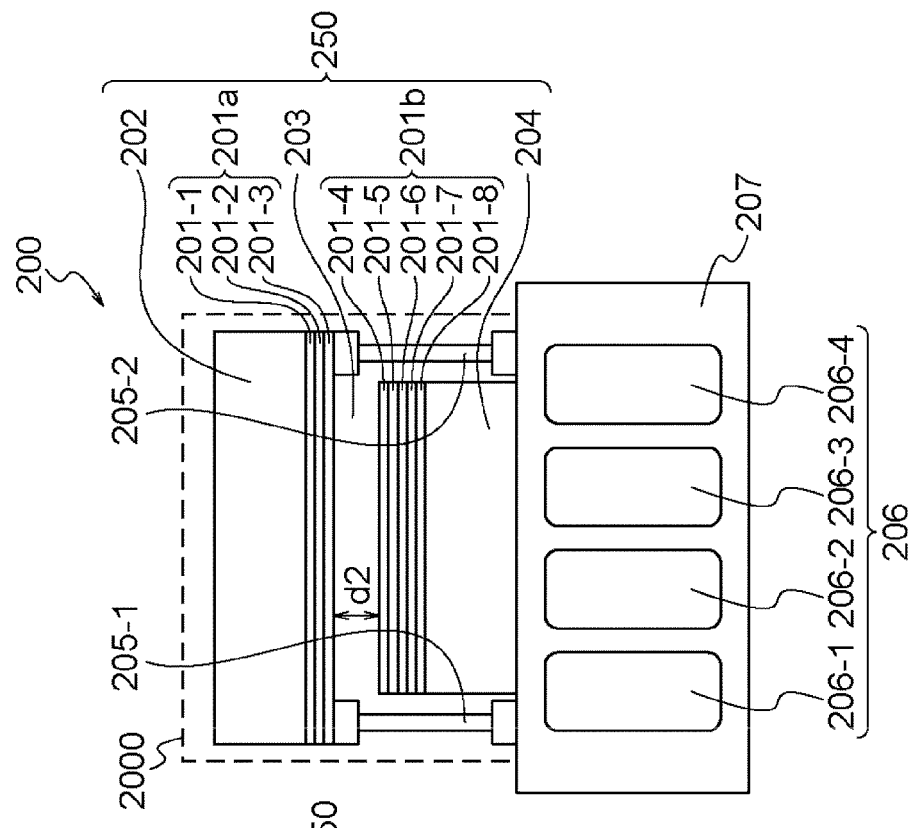
FIGS. 1A and 1B are cross-sectional views illustrating a configuration example of a sensor and a solid-state imaging apparatus according to the present technique.

Hereinafter, preferred modes for carrying out the present technique will be described with reference to the drawings. The embodiments described below illustrate examples of representative embodiments of the present technique, and the scope of the present technique shall not be narrowly interpreted. Note that the same reference signs are provided to the same or equivalent elements or members in the drawings, and the description will not be repeated.

Note that the description will be in the following order.
1. Overview of Present Technique
2. First Embodiment (Example 1 of Sensor)
3. Second Embodiment (Example 2 of Sensor)
4. Third Embodiment (Example 3 of Sensor)
5. Fourth Embodiment (Example 4 of Sensor)
6. Fifth Embodiment (Example of Solid-State Imaging Apparatus)
7. Sixth Embodiment (Example 1 of Electronic Apparatus)
8. Seventh Embodiment (Example 2 of Electronic Apparatus)
9. Example of Use of Solid-State Imaging Apparatus According to Present Technique

1. Overview of Present Technique

In the past, in a sensor (for example, image sensor, optical sensor, or the like) using an optical element, such as a Fabry-Perot resonator, or a CMOS image sensor (CIS), a multi-spectrum of red, green, and blue (RGB)+infrared (IR) or the like has been studied. However, the line width of the optical spectrum is narrow, and the optical spectrum has discrete spectral characteristics. Therefore, the optical spectrum is significantly different from the ideal spectrum, and the color reproducibility may be deteriorated. In addition, the spectral characteristics may not be continuous, and there may be a missing wavelength band. Important information may not be viewed due to the missing wavelength band. Furthermore, there is an increase in the spectral wavelengths, and the resolution may be degraded when the pixels are one-dimensionally or two-dimensionally arranged.

On the other hand, an example of a method of avoiding the degradation in resolution includes a technique of acquiring a plurality of wavelength bands in one pixel in an etalon structure using an air gap between small reflective mirrors. However, each spectrum is discrete, and continuous spectra may not be obtained.

The present technique has been made based on the circumstances, and the present technique attains advantageous effects of excellent reliability and excellent image quality. That is, according to the present technique, the line width of optical spectrum is not narrow, and the optical spectrum does not have discrete spectral characteristics. The optical spectrum is not significantly different from the ideal spectrum, and the color reproducibility is not deteriorated. There is no missing wavelength in the detected wave caused by discrete spectral characteristics, and important information is not missed due to the missing wavelength band. Furthermore, there is no increase in the spectral wavelengths, and the resolution is not degraded when the pixels are one-dimensionally or two-dimensionally arranged. More specifically, according to the present technique, detailed optical spectrum information and image information of the object can be acquired at the same time. Therefore, accurate color information can be acquired, and the color reproducibility is improved. All wavelengths can be acquired in one pixel, and a high-resolution image can be obtained. Furthermore, detailed continuous optical spectrum information can be acquired and applied to various biosensors regarding a tumor test, beauty, or spectroscopy. Accurate determination and decision can be made in a test, diagnosis, and the like.

2. First Embodiment (Example 1 of Sensor)

A first embodiment (example 1 of sensor) according to the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; and at least one photoelectric conversion element. The distance of the gap is changed to acquire continuous optical spectra.

The sensor of the first embodiment (example 1 of sensor) according to the present technique can acquire continuous optical spectra based on the optical element (for example, Fabry-Perot resonator) having the gap that transmits a specific wavelength range, based on the configuration of the sensor of the first embodiment, and based on devising in the driving method of the sensor of the first embodiment. In addition, the sensor of the first embodiment according to the present technique acquires detailed high-resolution continuous optical spectra to enable application for analysis in medical care, living body, and the like.

Next, a sensor 100 of the first embodiment according to the present technique will be described in detail with reference to FIG. 1A. FIG. 1A is a cross-sectional view illustrating a configuration example of the sensor 100. In FIG. 1A, the sensor 100 includes one optical element 150 and one photoelectric conversion element 106 (for example, photodiode (PD)). Although the optical element 150 is not particularly limited, an example of the optical element 150 includes a Fabry-Perot resonator.

The optical element 150 includes optical interference filters 101a (three-layer configuration of 101-1 to 101-3) and 101b (five-layer configuration of 101-4 to 101-8) for spectral diffraction arranged to face each other, a gap 103 between the optical interference filters 101a and 101b, and substrates 102 and 104. Examples of the optical interference filters 101a and 101b include dielectric multilayer films, reflective multilayer films, and the like.

The optical interference filter 101a that is a multilayer film includes three laminated layers including the optical interference filter 101-1, the optical interference filter 101-2, and the optical interference filter 101-3 in order from the upper layer (upper direction in FIG. 1A) that is the light incident side. Although it is only necessary that the optical interference filter 101a that is a multilayer film include alternately laminated layers including materials with different refractive indices, it is preferable that the optical interference filter 101-1 and the optical interference filter 101-3 be $TiO_2$ films or $TaO_2$ films and that the optical interference filter 101-2 be a $SiO_2$ film. The optical interference filter 101a is laminated on the substrate 102 on the optical interference filter 101-1 side in the optical interference filter 101a. An example of the substrate 102 includes a $SiO_2$ transparent substrate. Note that the substrate 102 is not particularly limited as long as the substrate 102 is plate-shaped or layered.

The optical interference filter 101b that is a multilayer film includes five laminated layers including the optical interference filter 101-4, the optical interference filter 101-5, the optical interference filter 101-6, the optical interference filter 101-7, and the optical interference filter 101-8 in order from the upper layer (upper direction in FIG. 1A) that is the light incident side. Although it is only necessary that the optical interference filter 101b that is a multilayer film include alternately laminated layers including materials with different refractive indices, it is preferable that the optical interference filter 101-4, the optical interference filter 101-6, and the optical interference filter 101-8 be $TiO_2$ films or $TaO_2$ films and that the optical interference filter 101-5 and the optical interference filter 101-7 be $SiO_2$ films. The optical interference filter 101b is laminated on the substrate 104 on the optical interference filter 101-8 side in the optical interference filter 101b. An example of the substrate 104 includes a $SiO_2$ transparent substrate. Note that the substrate 104 is not particularly limited as long as the substrate 104 is plate-shaped or layered.

A variable wavelength device 1000 included in the sensor 100 includes the optical element 150 and variable distance apparatuses 105-1 and 105-2. The variable distance apparatuses 105-1 and 105-2 can be used in the gap 103 to move, in the upper and lower directions in FIG. 1A, the substrate 102 and the optical interference filter 101a included in the upper direction on the light incident side of the optical element 150 (upper direction in FIG. 1A) to change a distance d1 of the gap 103. Continuous movement in the upper and lower directions, that is, continuous change in the distance d1, can continuously change the transmission spectral characteristics.

Figure 2A:
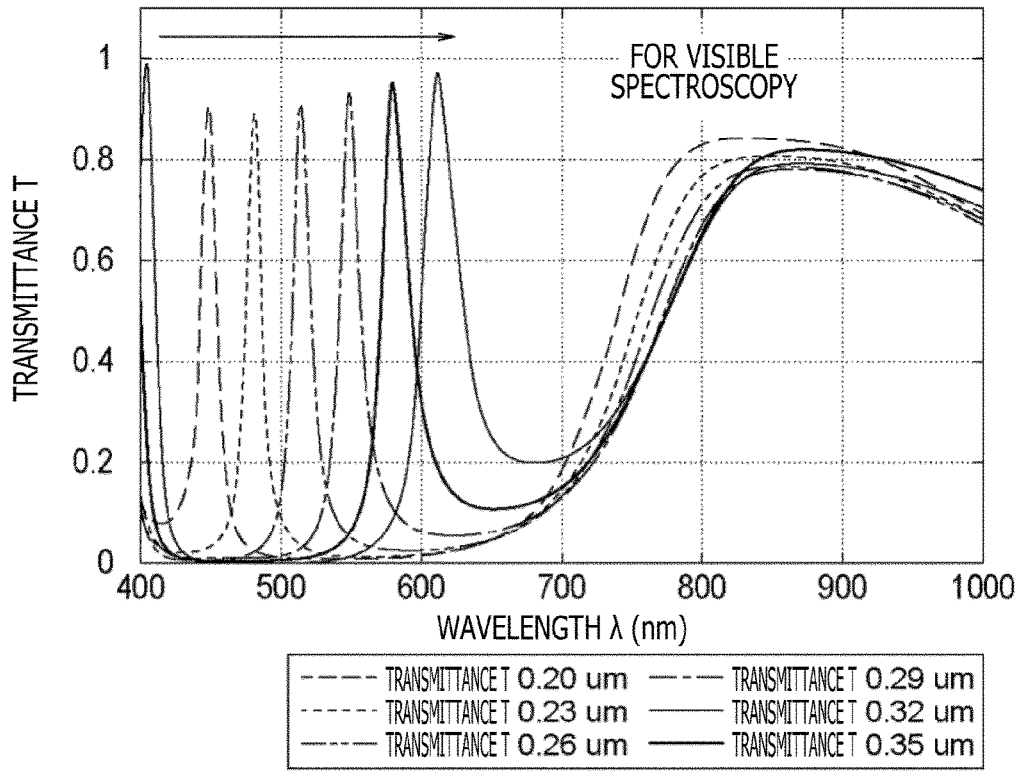
FIGS. 2A and 2B are graphs illustrating continuous optical spectra of visible light acquired by the sensor according to the present technique and continuous optical spectra of infrared light acquired by the solid-state imaging apparatus of Example 2 according to the present technique.

FIG. 2A illustrates results of continuous optical spectra of visible light acquired by the sensor 100. FIG. 2A illustrates a transmittance spectrum when the distance d1 of the gap 103 is changed in a range of 0.2 to 0.35 μm. As illustrated in FIG. 2A, it can be understood that a peak wavelength λ0 substantially linearly changes from 449 to 613 nm with respect to the change in the distance d1 of the gap 103 from 0.2 to 0.35 μm. Note that according to the present technique, continuous optical spectra of infrared light illustrated in FIG. 2B indicate results acquired by a solid-state imaging apparatus 400 of Example 2. It can be considered that in the sensor 100, the range of the peak wavelength λ0 of the continuous optical spectra of infrared light also substantially linearly changes with respect to the change in the distance d1 of the gap 103.

Although the method of using the variable distance apparatuses 105-1 and 105-2 to continuously move the gap 103 in the upper and lower directions can be a voluntary method, it is preferable to change the speed of the movement of the gap 103 in the upper and lower directions in conjunction with the speed of the movement of the object. For example, it is sufficient that the speed of the movement of the gap 103 in the upper and lower directions is increased when the movement of the object is fast, and the speed of the movement of the gap 103 in the upper and lower directions is reduced when the movement of the object slows down later. When the movement of the object is slow, the speed of the movement of the gap 103 in the upper and lower directions may be increased as in the case where the movement of the object is fast. However, the speed may be reduced to increase the exposure time to gain the signal strength. When the object is still, the speed may also be increased as in the case where the movement of the object is fast. However, the speed of the movement in the upper and lower directions may be further reduced to further increase the exposure time to further gain the signal strength.

The thing included in the gap 103 is not particularly limited as long as the thing can be moved by the variable distance apparatuses 105-1 and 105-2, and a liquid, a solid, a gas such as air, or the like may be included. However, it is preferable that the air be included (so-called air gap). The variable distance apparatuses 105-1 and 105-2 can be piezoelectric devices, such as piezo elements, or MEMS devices. In a lower layer (lower direction in FIG. 1A) of the variable wavelength device 1000, the sensor 100 includes a semiconductor substrate 107 and one photoelectric conversion element 106 formed on the semiconductor substrate 107. Note that although not illustrated, the sensor 100 is provided with a wiring layer in a lower layer (lower direction in FIG. 1A) of the semiconductor substrate 107.

Figure 3:
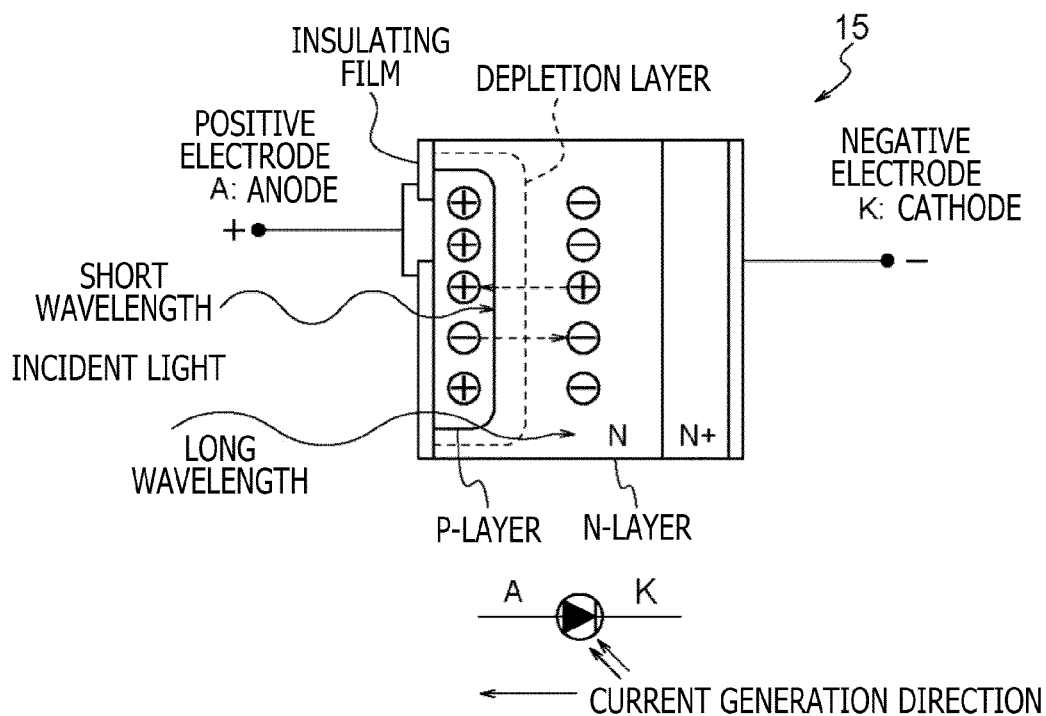
FIG. 3 is a diagram for describing signal reading by using a structure and a circuit of a photodiode included in the sensor and the solid-state imaging apparatus according to the present technique.

In the sensor 100, continuous optical spectra can be obtained in a state in which signal reading is not stored, that is, a signal is acquired by current reading. In the case of the current reading, a photocurrent generated by the photoelectric conversion element 106, such as a photodiode (PD) 15 (mainly, depletion layer of PN junction) illustrated in FIG. 3, is read at the same time while the distance d1 of the gap 103 (for example, air gap) is changed. In such a case, the structure and the circuit are as illustrated for example in FIG. 3. For a driving method, a reverse bias may be applied for reading. To further increase the sensitivity, the reverse bias may be increased and applied for avalanche multiplication of a photoelectron generated in the depletion layer in a high electric field state, and the photoelectron may be read as an optical signal.

Figure 4:
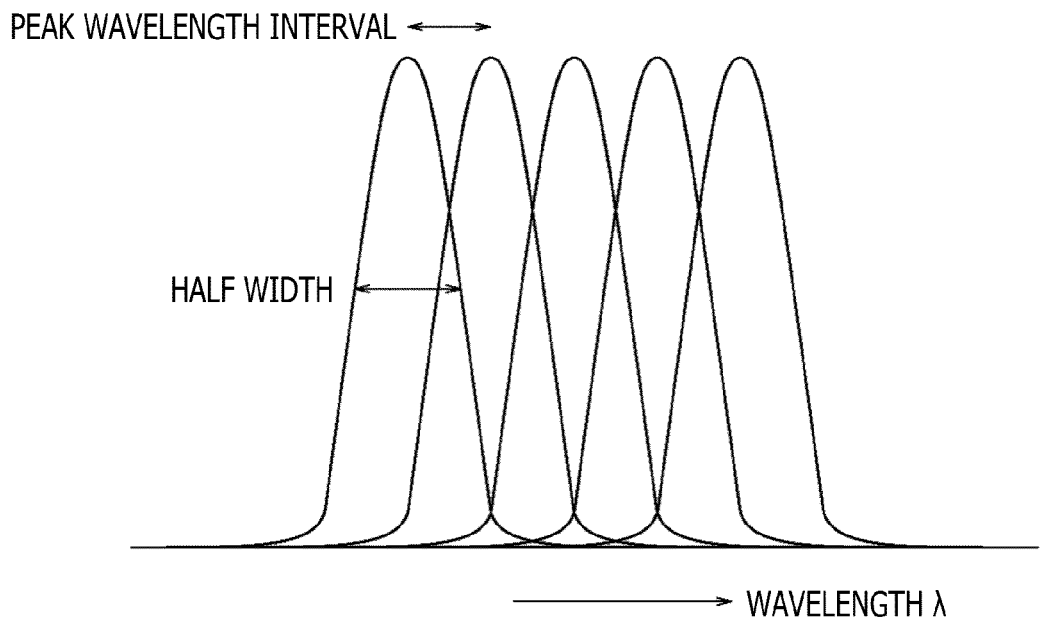
FIG. 4 is a diagram for describing continuous spectra.

Although the current value reading has been described, the storage time can also be reduced for instantaneous and fast reading in the reading based on storage to thereby detect pseudo continuous spectra. In this case, a floating diffusion (FD) may be provided as in a normal CMOS image sensor (CIS) to read the voltage signal. In this case, when the measurement is particularly at narrow wavelength intervals of equal to or smaller than a peak-half width, the overlapping of the peaks is sufficiently large, and pseudo continuous optical spectra are obtained as illustrated in FIG. 4 (graph illustrating relationship between peak wavelength intervals and peak half-width). In the pseudo continuous optical spectra acquired by the sensor 100, the peak wavelength interval of at least one set of two spectra adjacent to each other is preferably equal to or smaller than the peak half-width. That is, "peak wavelength interval≤≤peak half-width" holds. Note that the "peak wavelength interval" denotes the distance between the peaks of arbitrary two spectra adjacent to each other, and the peak half-width denotes the width of the spectrum (wavelength) at 50% of the peak value of each of the two spectra (arbitrary one spectrum).

3. Second Embodiment (Example 2 of Sensor)

A second embodiment (example 2 of sensor) according to the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; a first semiconductor substrate; a second semiconductor substrate; at least one photodiode formed on the first semiconductor substrate, the photodiode including a light receiving surface on a second main surface side of the first semiconductor substrate; a floating diffusion formed on a surface of a first main surface of the first semiconductor substrate; a first transistor formed on the first main surface of the first semiconductor substrate; a first wiring layer formed on the first main surface of the first semiconductor substrate; a first electrode exposed on a surface of the first wiring layer; a second transistor formed on a first main surface of the second semiconductor substrate; a second wiring layer formed on the first main surface of the second semiconductor substrate; a second electrode exposed on a surface of the second wiring layer; and a floating diffusion wire that connects the floating diffusion and a gate electrode of the second transistor through the first electrode and the second electrode. The first electrode and the second electrode are joined, the first semiconductor substrate and the second semiconductor substrate are pasted together, and the distance of the gap is changed to acquire continuous optical spectra.

The sensor of the second embodiment (example 2 of sensor) according to the present technique can acquire continuous optical spectra based on the optical element (for example, Fabry-Perot resonator) having the gap that transmits a specific wavelength range, based on the configuration of the sensor of the second embodiment, and based on devising in the driving method of the sensor of the second embodiment. In addition, the sensor of the second embodiment according to the present technique acquires detailed high-resolution continuous optical spectra to enable application for analysis in medical care, living body, and the like.

Figure 5:
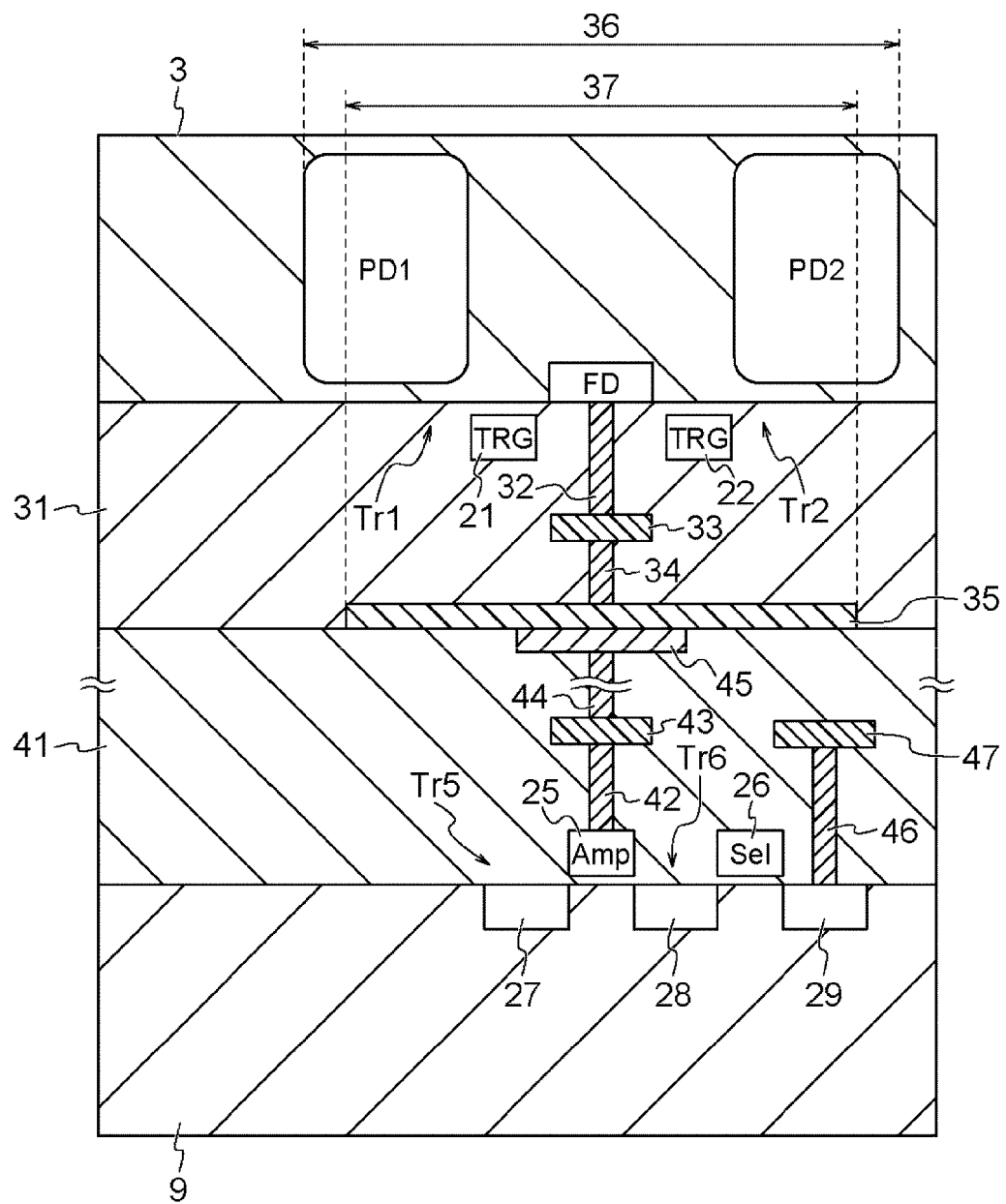
FIG. 5 is a cross-sectional view illustrating a configuration example of a laminate structure included in the sensor or the solid-state imaging apparatus according to the present technique.

Next, the sensor of the second embodiment according to the present technique will be described in detail with reference to FIG. 5. FIG. 5 is a cross-sectional view illustrating a configuration example of a laminate structure included in the sensor of the second embodiment according to the present technique. Note that although the variable wavelength device included in the sensor of the second embodiment according to the present technique is not illustrated in FIG. 5, the variable wavelength device included in the sensor of the second embodiment according to the present technique can be the variable wavelength device 1000 included in the sensor of the first embodiment according to the present technique or a variable wavelength device 2000 included in a solid-state imaging apparatus of a fifth embodiment according to the present technique described later.

As illustrated in FIG. 5, the sensor of the second embodiment includes a sensor base 3 (first semiconductor substrate) and a circuit base 9 (second semiconductor substrate) pasted together, with a first wiring layer 31 and a second wiring layer 41 facing each other. In addition, a first electrode 35 formed on a surface of the first wiring layer 31 of the sensor base 3 and a second electrode 45 formed on a surface of the second wiring layer 41 of the circuit base 9 are joined at the pasted surface of the sensor base 3 and the circuit base 9.

As illustrated in FIG. 5, photodiodes PD1 and PD2, a floating diffusion FD, and transfer gate electrodes 21 and 22 are formed on the sensor substrate 3. In the sensor substrate 3, the upper part of FIG. 5 is the incident surface of light, and the lower part is the circuit formation surface. The floating diffusion FD and the transfer gate electrodes 21 and 22 are formed on the circuit formation surface side of the sensor base 3.

The first wiring layer 31 is formed on the circuit formation surface of the sensor base 3. The first wiring layer 31 has a laminate configuration including a wire, which includes at least one layer, and an insulating layer. In FIG. 5, the first wiring layer 31 includes a wire 33 with one layer. A plug 32 connected to the floating diffusion FD is formed on the first wiring layer 31. In addition, the plug 32 and the wire 33 are connected, and the wire 33 and a plug 34 are further connected. Note that other wires not illustrated are provided in the same layer as the wire 33. The wires in the same layer as the wire 33 are, for example, power supply wiring, ground wiring, and the like connected to the transfer gate electrodes 21 and 22. The first electrode 35 for connection is formed on the surface of the first wiring layer 31. The first electrode 35 is connected to the floating diffusion FD through the plugs 32 and 34 and the wire 33.

A control circuit of a pixel unit not illustrated and a logic circuit including a signal processing circuit are mounted on the circuit base 9. In addition, pixel transistors other than a transfer transistor Tr1 are formed on the circuit base 9. FIG. 5 illustrates an amplification transistor Tr5 and a selection transistor Tr6. Diffusion regions 27, 28, and 29 as sources/drains of the amplification transistor Tr5 and the selection transistor Tr6 are formed on a surface of the circuit base 9. In addition, an amplification gate electrode 25 and a selection gate electrode 26 are provided on the circuit base 9.

The second wiring layer 41 is formed on the circuit base 9. The second wiring layer 41 has a laminate configuration including a wire, which includes a plurality of layers, and an insulating layer. FIG. 5 illustrates wires 43 and 47 with one layer among the plurality of wires formed on the second wiring layer 41. The wire 43 is connected to the amplification gate electrode 25 and the second electrode 45 on the surface of the second wiring layer 41 through plugs 42 and 44. Therefore, the second electrode 45 is connected to the amplification gate electrode 25 through the plugs 42 and 44 and the wire 43. In addition, a plug 46 and the wire 47 are connected to the diffusion region 29 of the selection transistor Tr6.

In the configuration, a conductor is used to directly connect the floating diffusion FD provided on the surface of the sensor base 3 and the amplification gate electrode 25 provided on the circuit base 9 through the first electrode 35 and the second electrode 45. That is, the floating diffusion FD and the amplification gate electrode 25 are connected through a floating diffusion wire (hereinafter, FD wire) including the first electrode 35, the second electrode 45, the plugs 32, 34, 42, and 44, and the wires 33 and 43.

In this way, the pixel transistors for processing the signals stored in the floating diffusion FD of the sensor base 3 are formed on the circuit base 9.

In the first wiring layer 31, it is preferable that the first electrode 35, the plugs 32 and 34, and the wire 33 of the FD wire be formed at the minimum design rule wiring width to increase the conversion efficiency. It is also preferable that the part from the floating diffusion FD to the first electrode 35 be connected at the shortest distance to similarly increase the conversion efficiency. Furthermore, it is preferable that the plugs 32 and 34 and the wire 33 be formed away from the other wires as much as possible to prevent capacitive coupling to the other wires formed in the first wiring layer 31. Similarly, in the second wiring layer 41, it is preferable that the second electrode 45, the plugs 44 and 42, and the wire 43 of the FD wire be formed at the minimum design rule wiring width to increase the conversion efficiency. It is also preferable that the part from the amplification gate electrode 25 to the second electrode 45 be connected at the shortest distance to increase the conversion efficiency. Furthermore, it is preferable that the plugs 44 and 42 and the wire 43 be formed away from the other wires as much as possible to prevent capacitive coupling to the other wires formed in the second wiring layer 41.

In addition, a reset transistor not illustrated may be formed between pixel sharing units on the sensor base 3 side or may be formed at other part on the circuit base 9 side. To increase the area of the photodiode PD of the sensor base 3, it is preferable that all of the transistors other than the transfer transistor be formed on the circuit base 9 side.

A region 37 forming the first electrode 35 and the second electrode 45 is smaller than the area of a region 36 provided with a plurality of photodiodes PD1 to PD4 (PD3 and PD4 are not illustrated) sharing the amplification transistor Tr5. To avoid contact with the electrodes of the other adjacent regions, the first electrode 35 and the second electrode 45 need to be smaller than the region 36 provided with the photodiodes PD1 and PD2. In addition, it is preferable that at least one of the first electrode 35 or the second electrode 45 be formed larger than the area of the part provided with the floating diffusion FD.

It is preferable that the first electrode 35 and the second electrode 45 be provided at the center of the pixel sharing unit. Furthermore, it is preferable that the first electrode 35 and the second electrode 45 be formed in point-symmetric or line-symmetric shapes. For example, it is preferable that in a four-pixel sharing unit, the center of the four-pixel sharing unit and the center of the first electrode 35 and the second electrode 45 be formed at the same plane position. In addition, it is preferable to form the first electrode 35 and the second electrode 45 in point-symmetric or line-symmetric shapes at the center of the pixel sharing unit. By forming the first electrode 35 and the second electrode 45 in such a configuration, the FD wires can be formed at equal intervals in a plurality of pixel sharing units, and coupling of the FD wires can be prevented.

In the sensor (semiconductor apparatus) in which a plurality of bases is pasted together as in the present embodiment, there is a problem in the positioning accuracy of the pasted surfaces of the bases. Therefore, when the bases are pasted together, the joint positions of the electrodes are misaligned according to the positioning accuracy of the bases. Poor connection or poor conduction caused by the misalignment of the joined electrodes reduces the reliability of the sensor (semiconductor apparatus). On the other hand, the shapes of the first electrode 35 and the second electrode 45 can be set in the range as illustrated in FIG. 5, and the connection reliability of the joined electrodes can be ensured regardless of the accuracy of base pasting. Therefore, the reliability of the sensor (semiconductor apparatus) improves.

However, an increase in the areas of the electrodes inevitably increases the volume of the FD wire. This leads to a deterioration in the conversion efficiency of signal charge. Therefore, it is preferable to minimize the areas of the electrodes as much as possible to prevent the deterioration in the conversion efficiency. In this way, the areas of the first electrode 35 and the second electrode 45 have contradictory effects on the conversion efficiency and the joint reliability. Therefore, the position accuracy of base pasting, the conversion efficiency of signal, and the like need to be taken into account to design the shapes of the first electrode 35 and the second electrode 45.

The connection reliability can be ensured if the area of one of the electrodes is large even if the area of the other electrode is small. Therefore, for example, one of the electrodes can be formed larger than the area of the part provided with the floating diffusion FD, and the area of the other electrode can be a smaller area. In this case, an improvement in characteristics can be expected in relation to both the connection reliability of electrodes and the conversion efficiency of signal.

Note that the laminate structure included in the sensor of the second embodiment can also acquire the signal by current reading. The current can be read by turning on one of the transfer transistor Tr1 (transfer gate electrode 21) and a transfer transistor Tr2 (transfer gate electrode 22) and maintaining the open state of the gate. The signal amplified by the amplification gate electrode 25 (amplifier) on the circuit base 9 (lower layer chip) is read in this case. In FIG. 5, the floating diffusion FD is shared by four pixels (PD1 and PD2, however, PD3 and PD4 are not illustrated), and the current needs to be separately read for each pixel.

As described above, the laminate structure included in the sensor of the second embodiment can acquire the signal by voltage reading. The charge is once stored in the photodiode (PD) and/or the floating diffusion FD, and then the transfer transistor Tr1 (transfer gate electrode 21) or the transfer transistor Tr2 (transfer gate electrode 22) operates to read the voltage. In FIG. 5, the floating diffusion FD is shared by four pixels (PD1 and PD2, however, PD3 and PD4 are not illustrated), and the voltage needs to be separately read for each pixel.

4. Third Embodiment (Example 3 of Sensor)

A third embodiment (example 3 of sensor) according to the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; a first semiconductor substrate; a second semiconductor substrate; at least one photodiode formed on the first semiconductor substrate, the photodiode including a light receiving surface on a second main surface side of the first semiconductor substrate; a floating diffusion formed on a surface of a first main surface of the first semiconductor substrate; a first transistor formed on the first main surface of the first semiconductor substrate; a first wiring layer formed on the first main surface of the first semiconductor substrate; a first electrode exposed on a surface of the first wiring layer; a second transistor formed on a first main surface of the second semiconductor substrate; a second wiring layer formed on the first main surface of the second semiconductor substrate; a second electrode exposed on a surface of the second wiring layer; and a floating diffusion wire that connects the floating diffusion and a gate electrode of the second transistor through the first electrode and the second electrode. The first electrode and the second electrode are joined, the first semiconductor substrate and the second semiconductor substrate are pasted together, and the distance of the gap is changed to acquire continuous optical spectra.

The sensor of the third embodiment (example 3 of sensor) according to the present technique can acquire continuous optical spectra based on the optical element (for example, Fabry-Perot resonator) having the gap that transmits a specific wavelength range, based on the configuration of the sensor of the third embodiment, and based on devising in the driving method of the sensor of the third embodiment. In addition, the sensor of the third embodiment according to the present technique acquires detailed high-resolution continuous optical spectra to enable application for analysis in medical care, living body, and the like.

Figure 6:
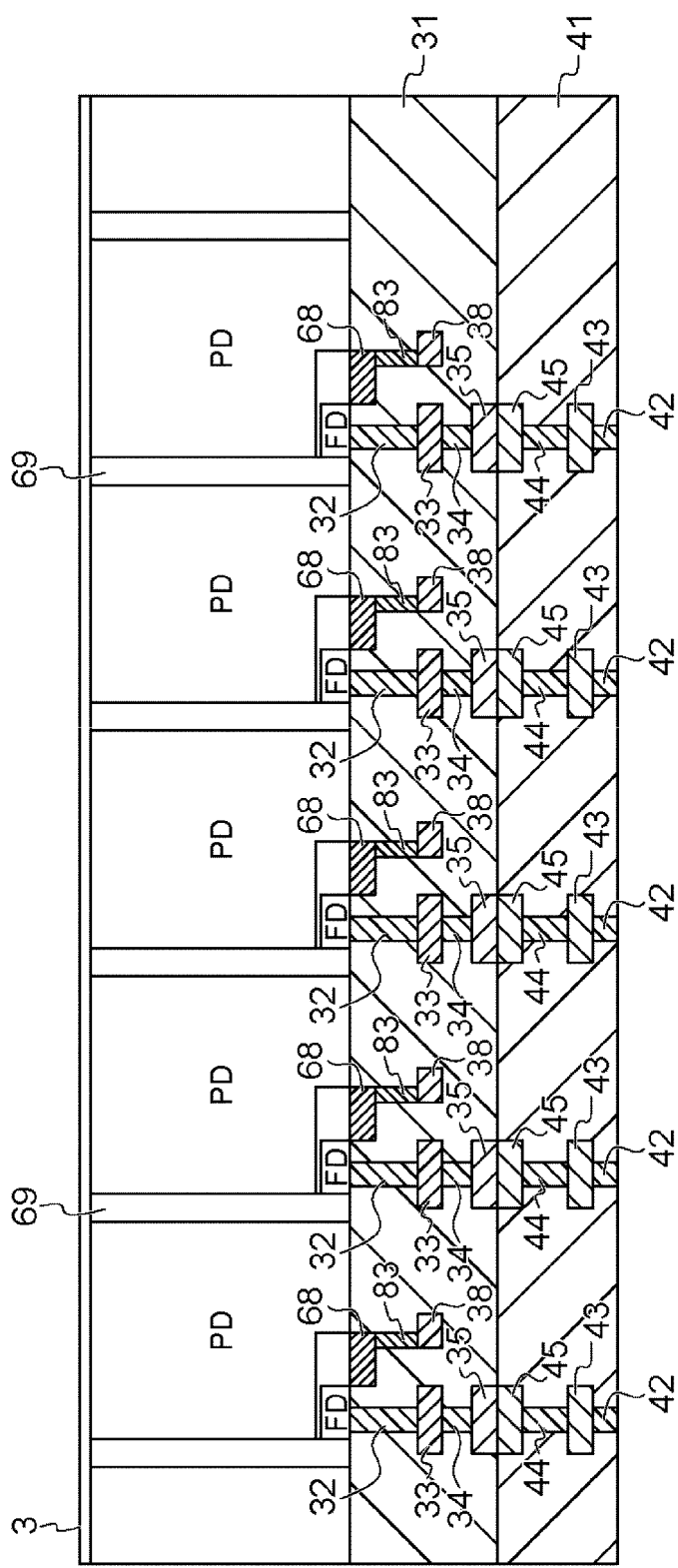
FIG. 6 is a cross-sectional view illustrating a configuration example of a laminate structure included in the sensor or the solid-state imaging apparatus according to the present technique.

Next, the sensor of the third embodiment according to the present technique will be described in detail with reference to FIG. 6. FIG. 6 is a cross-sectional view illustrating a configuration example of a laminate structure included in the sensor of the third embodiment according to the present technique. Note that although the variable wavelength device included in the sensor of the third embodiment according to the present technique is not illustrated in FIG. 6, the variable wavelength device included in the sensor of the third embodiment according to the present technique can be the variable wavelength device 1000 included in the sensor of the first embodiment according to the present technique or the variable wavelength device 2000 included in the solid-state imaging apparatus of the fifth embodiment according to the present technique described later.

Figure 14:
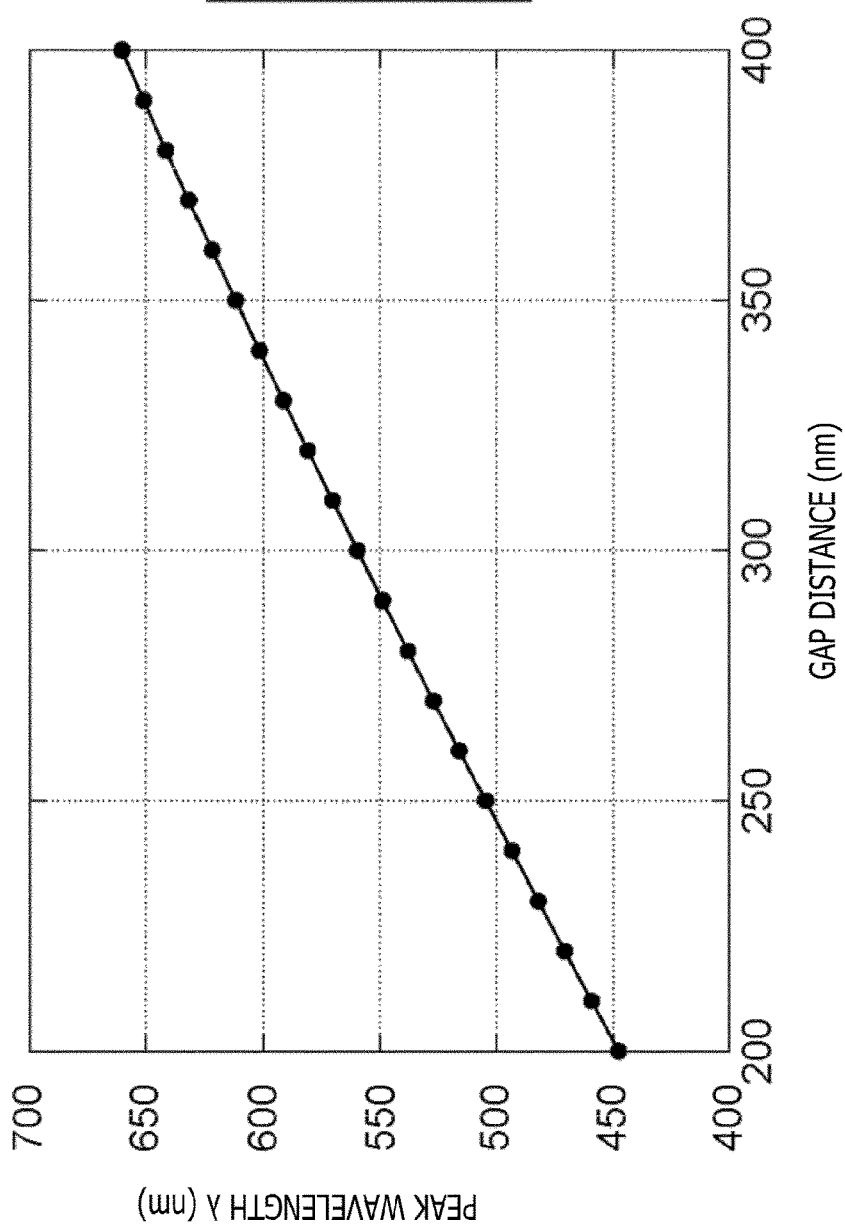
FIG. 14 is a diagram illustrating a relationship between a peak wavelength (AO) and a gap distance (d) in the solid-state imaging apparatus of Example 1 according to the present technique.

The sensor of the third embodiment includes the sensor base 3 (first semiconductor substrate) and the circuit base pasted together, with the first wiring layer 31 and the second wiring layer 41 facing each other. In addition, as illustrated in FIG. 14, the first electrode 35 formed on the surface of the first wiring layer 31 of the sensor base 3 and the second electrode 45 formed on the surface of the second wiring layer 41 of the circuit base 9 are joined at the pasted surface of the sensor base 3 and the circuit base. Note that FIG. 6 illustrates only the configuration of the second wiring layer 41, and the configuration of the circuit base is not illustrated. The circuit base included in the sensor of the third embodiment can have a configuration similar to the circuit base 9.

An element separation unit 69 separates the photodiode PD and the floating diffusion FD of each pixel from the photodiode PD and the floating diffusion FD of an adjacent pixel. In addition, the FD wire including the plugs 32, 34, 44, and 42 and the wires 33 and 43 is formed from the floating diffusion FD to the pixel transistors other than the transfer transistor of the circuit base not illustrated.

A TRG wire 38 is connected to a transfer gate electrode 68 through a plug 83. The TRG wire is connected to the circuit substrate side outside of the pixel region. In addition, a plurality of photodiodes PD shares the pixel transistors other than the transfer transistor in the sensor of the third embodiment as in the second embodiment. For example, a plurality of FD wires can be connected through wires or electrodes, and a plurality of photodiodes PD and floating diffusions FD can share the pixel transistors other than the transfer transistor.

Note that the laminate structure included in the sensor of the third embodiment can also acquire the signal by current reading. The current can be read by turning on the transfer transistor (not illustrated) (transfer gate electrode 68) and maintaining the open state of the gate. The signal amplified by the amplification gate electrode (amplifier) (not illustrated) on the circuit base (lower layer chip) is read in this case. In FIG. 6, the floating diffusion FD and the electrode plugs 32, 34, 44, and 42 are provided for each pixel (one PD), and the current can be read from all of the pixels at the same time.

As described above, the laminate structure included in the sensor of the third embodiment can acquire the signal by voltage reading. The charge is once stored in the photodiode (PD) and/or the floating diffusion FD, and then the transfer transistor (not illustrated) (transfer gate electrode 68) operates to read the voltage. In FIG. 6, the floating diffusion FD and the electrode plugs 32, 34, 44, and 42 are provided for each pixel (one PD), and the voltage can be read from all of the pixels at the same time.

5. Fourth Embodiment (Example 4 of Sensor)

A fourth embodiment (example 4 of sensor) according to the present technique provides a sensor including: at least one variable wavelength device including an optical element including at least two optical interference filters, the at least two optical interference filters arranged to face each other, the optical element having a gap between the at least two optical interference filters arranged to face each other, and a variable distance apparatus that changes a distance of the gap; a first semiconductor substrate; a second semiconductor substrate; at least one photodiode formed on the first semiconductor substrate, the photodiode including a light receiving surface on a second main surface side of the first semiconductor substrate; a first transistor formed on a first main surface of the first semiconductor substrate; a first wiring layer formed on the first main surface of the first semiconductor substrate; a first electrode exposed on a surface of the first wiring layer; a second transistor formed on a first main surface of the second semiconductor substrate; a second wiring layer formed on the first main surface of the second semiconductor substrate; a second electrode exposed on a surface of the second wiring layer; and a current reading wire that connects a third electrode of the at least one photodiode and a gate electrode of the second transistor through the first electrode and the second electrode. The first electrode and the second electrode are joined, the first semiconductor substrate and the second semiconductor substrate are pasted together, and the distance of the gap is changed to acquire continuous optical spectra.

The sensor of the fourth embodiment (example 4 of sensor) according to the present technique can acquire continuous optical spectra based on the optical element (for example, Fabry-Perot resonator) having the gap that transmits a specific wavelength range, based on the configuration of the sensor of the fourth embodiment, and based on devising in the driving method of the sensor of the fourth embodiment. In addition, the sensor of the fourth embodiment according to the present technique acquires detailed high-resolution continuous optical spectra to enable application for analysis in medical care, living body, and the like.

Figure 7:
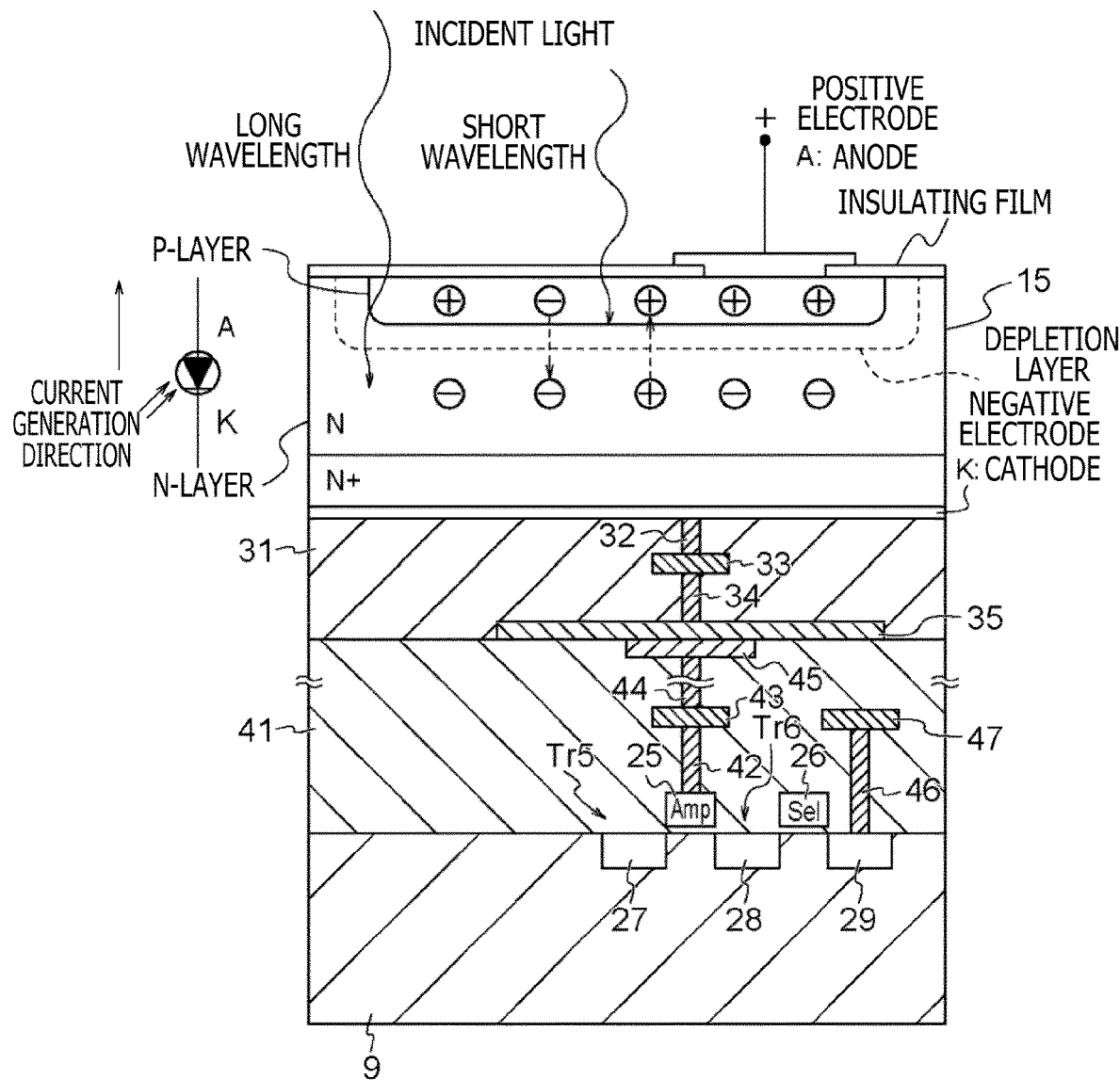
FIG. 7 is a cross-sectional view illustrating a configuration example of a laminate structure included in the sensor or the solid-state imaging apparatus according to the present technique.

Next, the sensor of the fourth embodiment according to the present technique will be described in detail with reference to FIG. 7. FIG. 7 is a cross-sectional view illustrating a configuration example of a laminate structure included in the sensor of the fourth embodiment according to the present technique. Note that although the variable wavelength device included in the sensor of the fourth embodiment according to the present technique is not illustrated in FIG. 7, the variable wavelength device included in the sensor of the fourth embodiment according to the present technique can be the variable wavelength device 1000 included in the sensor of the first embodiment according to the present technique or the variable wavelength device 2000 included in the solid-state imaging apparatus of the fifth embodiment according to the present technique described later.

As illustrated in FIG. 7, the sensor of the fourth embodiment includes the photodiode 15 formed on the sensor base (first semiconductor substrate) (not illustrated) and the circuit base 9 (second semiconductor substrate) pasted together, with the first wiring layer 31 and the second wiring layer 41 facing each other. In addition, the first electrode 35 formed on the surface of the first wiring layer 31 of the sensor base and the second electrode 45 formed on the surface of the second wiring layer 41 of the circuit base 9 are joined at the pasted surface of the sensor base and the circuit base 9.

In the sensor base provided with the photodiode 15, the upper part of FIG. 7 is the incident surface of light, and the lower part is the circuit formation surface.

The first wiring layer 31 is formed on the circuit formation surface of the sensor base. The first wiring layer 31 has a laminate configuration including a wire, which includes at least one layer, and an insulating layer. In FIG. 7, the first wiring layer 31 includes the wire 33 with one layer. The plug 32 connected to a negative electrode (K: cathode) (also referred to as third electrode, the same applies hereinafter) is formed on the first wiring layer 31. In addition, the plug 32 and the wire 33 are connected, and the wire 33 and the plug 34 are further connected. Note that other wires not illustrated may be provided on the same layer as the wire 33. The first electrode 35 for connection is formed on the surface of the first wiring layer 31. The first electrode 35 is connected to the negative electrode (K: cathode) through the plugs 32 and 34 and the wire 33.

A control circuit of a pixel unit not illustrated and a logic circuit including a signal processing circuit are mounted on the circuit base 9. In addition, pixel transistors other than the transfer transistor Tr1 are formed on the circuit base 9.

FIG. 7 illustrates the amplification transistor Tr5 and the selection transistor Tr6. The diffusion regions 27, 28, and 29 as sources/drains of the amplification transistor Tr5 and the selection transistor Tr6 are formed on the surface of the circuit base 9. In addition, the amplification gate electrode 25 and the selection gate electrode 26 are provided on the circuit base 9.

The second wiring layer 41 is formed on the circuit base 9. The second wiring layer 41 has a laminate configuration including a wire, which includes a plurality of layers, and an insulating layer. FIG. 7 illustrates the wires 43 and 47 with one layer among the plurality of wires formed on the second wiring layer 41. The wire 43 is connected to the amplification gate electrode 25 and the second electrode 45 on the surface of the second wiring layer 41 through plugs 42 and 44. Therefore, the second electrode 45 is connected to the amplification gate electrode 25 through the plugs 42 and 44 and the wire 43. In addition, the plug 46 and the wire 47 are connected to the diffusion region 29 of the selection transistor Tr6.

In the configuration, a conductor is used to directly connect the negative electrode (K: cathode) and the amplification gate electrode 25 provided on the circuit base 9 through the first electrode 35 and the second electrode 45. That is, the negative electrode (K: cathode) and the amplification gate electrode 25 are connected through a current reading wire including the first electrode 35, the second electrode 45, the plugs 32, 34, 42, and 44, and the wires 33 and 43. In this way, the pixel transistors for processing the signals through the current reading wire are formed on the circuit base 9.

In the first wiring layer 31, it is preferable that the first electrode 35, the plugs 32 and 34, and the wire 33 of the current reading wire be formed at the minimum design rule wiring width to increase the conversion efficiency. It is also preferable that the part from the negative electrode (K: cathode) to the first electrode 35 be connected at the shortest distance to similarly increase the conversion efficiency. Furthermore, it is preferable that the plugs 32 and 34 and the wire 33 be formed away from the other wires as much as possible to prevent capacitive coupling to the other wires formed in the first wiring layer 31. Similarly, in the second wiring layer 41, it is preferable that the second electrode 45, the plugs 44 and 42, and the wire 43 of the current reading wire be formed at the minimum design rule wiring width to increase the conversion efficiency. It is also preferable that the part from the amplification gate electrode 25 to the second electrode 45 be connected at the shortest distance to increase the conversion efficiency. Furthermore, it is preferable that the plugs 44 and 42 and the wire 43 be formed away from the other wires as much as possible to prevent capacitive coupling to the other wires formed in the second wiring layer 41.

In addition, a reset transistor not illustrated may be formed between pixel sharing units on the sensor base side or may be formed at other part on the circuit base 9 side. To increase the area of the photodiode (PD) 15 of the sensor base, it is preferable that all of the transistors other than the transfer transistor be formed on the circuit base 9 side.

It is preferable that the first electrode 35 and the second electrode 45 be provided at the center of the pixel sharing unit. Furthermore, it is preferable that the first electrode 35 and the second electrode 45 be formed in point-symmetric or line-symmetric shapes. For example, it is preferable that in a four-pixel sharing unit, the center of the four-pixel sharing unit and the center of the first electrode 35 and the second electrode 45 be formed at the same plane position. In addition, it is preferable to form the first electrode 35 and the second electrode 45 in point-symmetric or line-symmetric shapes at the center of the pixel sharing unit. By forming the first electrode 35 and the second electrode 45 in such a configuration, the current reading wires can be formed at equal intervals in a plurality of pixel sharing units, and coupling of the current reading wires can be prevented.

In the sensor (semiconductor apparatus) in which a plurality of bases is pasted together as in the present embodiment, there is a problem in the positioning accuracy of the pasted surfaces of the bases. Therefore, when the bases are pasted together, the joint positions of the electrodes are misaligned according to the positioning accuracy of the bases. Poor connection or poor conduction caused by the misalignment of the joined electrodes reduces the reliability of the sensor (semiconductor apparatus). On the other hand, the shapes of the first electrode 35 and the second electrode 45 can be in an appropriate range as illustrated in FIG. 7, and the connection reliability of the joined electrodes can be ensured regardless of the accuracy of base pasting. Therefore, the reliability of the sensor (semiconductor apparatus) improves.

However, an increase in the areas of the electrodes inevitably increases the volume of the current reading wire. This leads to a deterioration in the conversion efficiency of signal charge. Therefore, it is preferable to minimize the areas of the electrodes as much as possible to prevent the deterioration in the conversion efficiency. In this way, the areas of the first electrode 35 and the second electrode 45 have contradictory effects on the conversion efficiency and the joint reliability. Therefore, the position accuracy of base pasting, the conversion efficiency of signal, and the like need to be taken into account to design the shapes of the first electrode 35 and the second electrode 45. The connection reliability can be ensured if the area of one of the electrodes is large even if the area of the other electrode is small. In this case, an improvement in characteristics can be expected in relation to both the connection reliability of electrodes and the conversion efficiency of signal.

As described above, the laminate structure included in the sensor of the fourth embodiment can acquire the signal by only current reading. The current reading wire can be used to continuously read the current. The signal amplified by the amplification gate electrode 25 (amplifier) on the circuit base 9 (lower layer chip) is read in this case.

6. Fifth Embodiment (Example of Solid-State Imaging Apparatus)

A fifth embodiment (example of solid-state imaging apparatus) according to the present technique provides a solid-state imaging apparatus including at least one sensor of at least one embodiment among the sensor of the first embodiment, the sensor of the second embodiment, the sensor of the third embodiment, and the sensor of the fourth embodiment according to the present technique. A plurality of pixels is one-dimensionally or two-dimensionally arranged.

The solid-state imaging apparatus of the fifth embodiment (example of solid-state imaging apparatus) according to the present technique can acquire continuous optical spectra based on the optical element (for example, Fabry-Perot resonator) having the gap that transmits a specific wavelength range, based on the configuration of the solid-state imaging apparatus of the fifth embodiment, and based on devising in the driving method of the solid-state imaging apparatus of the fifth embodiment. In addition, the solid-state imaging apparatus of the fifth embodiment according to the present technique acquires detailed high-resolution continuous optical spectra to enable application for analysis in medical care, living body, and the like.

Figure 1B:
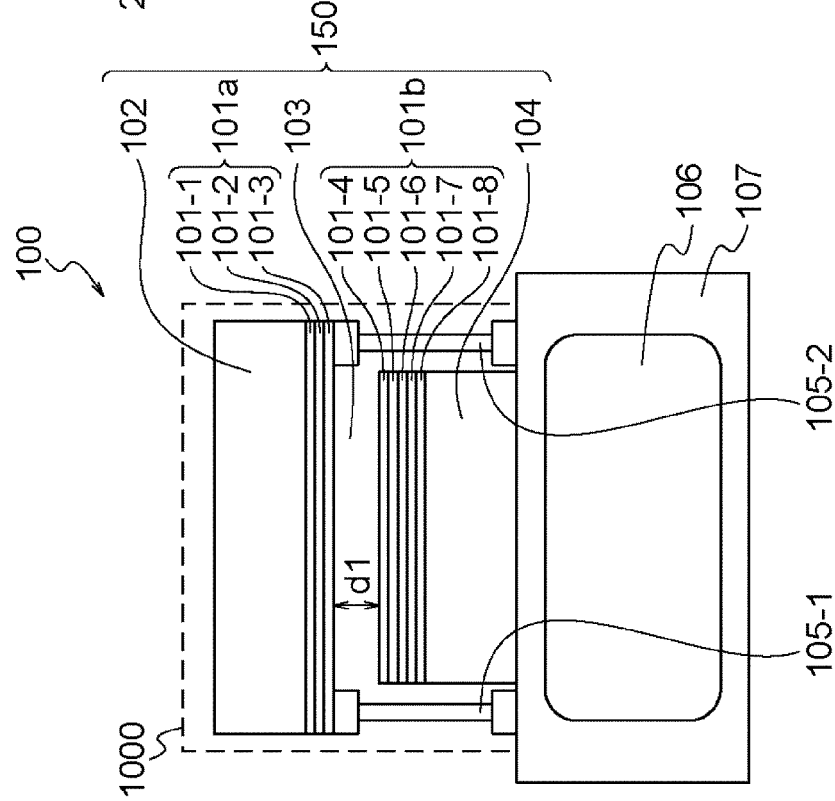

Next, a solid-state imaging apparatus 200 of the fifth embodiment according to the present technique will be described in detail with reference to FIG. 1B. FIG. 1B is a cross-sectional view illustrating a configuration example of the solid-state imaging apparatus 200. In FIG. 1B, the solid-state imaging apparatus 200 includes an optical element 250 and four photoelectric conversion elements 206 (206-1 to 206-4) (for example, photodiodes (PD)) arranged in a lateral direction (left-right direction in FIG. 1B) in four pixels. Although the optical element 250 is not particularly limited, an example of the optical element 250 includes a Fabry-Perot resonator.

The optical element 250 includes optical interference filters 201a (three-layer configuration of 201-1 to 201-3) and 201b (five-layer configuration of 201-4 to 201-8) for spectral diffraction arranged to face each other, a gap 203 between the optical interference filters 201a and 201b, and substrates 202 and 204. Examples of the optical interference filters 201a and 201b include dielectric multilayer films, reflective multilayer films, and the like.

The optical interference filter 201a that is a multilayer film includes three laminated layers including the optical interference filter 201-1, the optical interference filter 201-2, and the optical interference filter 201-3 in order from the upper layer (upper direction in FIG. 1B) that is the light incident side. Although it is only necessary that the optical interference filter 201a that is a multilayer film include alternately laminated layers including materials with different refractive indices, it is preferable that the optical interference filter 201-1 and the optical interference filter 201-3 be $TiO_2$ films or $TaO_2$ films and that the optical interference filter 201-2 be a $SiO_2$ film. The optical interference filter 201a is laminated on the substrate 202 on the optical interference filter 201-1 side in the optical interference filter 201a. An example of the substrate 202 includes a $SiO_2$ transparent substrate. Note that the substrate 202 is not particularly limited as long as the substrate 202 is plate-shaped or layered.

The optical interference filter 201b that is a multilayer film includes five laminated layers including the optical interference filter 201-4, the optical interference filter 201-5, the optical interference filter 201-6, the optical interference filter 201-7, and the optical interference filter 201-8 in order from the upper layer (upper direction in FIG. 1B) that is the light incident side. Although it is only necessary that the optical interference filter 201b that is a multilayer film include alternately laminated layers including materials with different refractive indices, it is preferable that the optical interference filter 201-4, the optical interference filter 201-6, and the optical interference filter 201-8 be $TiO_2$ films or $TaO_2$ films and that the optical interference filter 201-5 and the optical interference filter 201-7 be $SiO_2$ films. The optical interference filter 201b is laminated on the substrate 204 on the optical interference filter 201-8 side in the optical interference filter 201b. An example of the substrate 204 includes a $SiO_2$ transparent substrate. Note that the substrate 204 is not particularly limited as long as the substrate 204 is plate-shaped or layered.

The variable wavelength device 2000 included in the solid-state imaging apparatus 200 includes the optical element 250 and variable distance apparatuses 205-1 and 205-2. The variable distance apparatuses 205-1 and 205-2 can be used in the gap 203 to move, in the upper and lower directions in FIG. 1B, the substrate 202 and the optical interference filter 201a included in the upper direction on the light incident side of the optical element 250 (upper direction in FIG. 1A) to change a distance d2 of the gap 203. Continuous movement in the upper and lower directions, that is, continuous change in the distance d2 of the gap 203, can continuously change the transmission spectral characteristics.

Figure 2B:
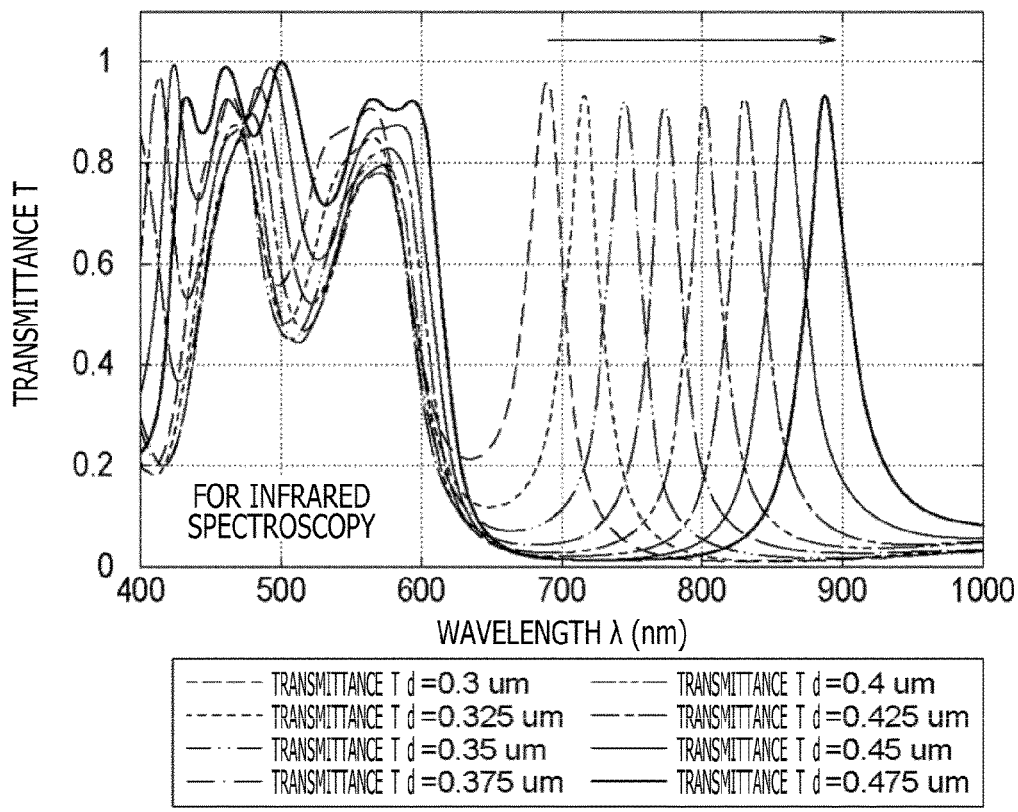

According to the present technique, the continuous optical spectra of visible light illustrated in FIG. 2A are results acquired by the sensor 100, and it can be considered that in the solid-state imaging apparatus 200, the range of the peak wavelength λ0 of the continuous optical spectra of visible light also substantially linearly changes with respect to the change in the distance d2 of the gap 203. The continuous optical spectra of infrared light illustrated in FIG. 2B are results acquired by the solid-state imaging apparatus 400 of Example 2, and it can be considered that in the solid-state imaging apparatus 200, the range of the peak wavelength λ0 of the continuous optical spectra of infrared light also substantially linearly changes with respect to the change in the distance d2 of the gap 203.

Although the method of using the variable distance apparatuses 205-1 and 205-2 to continuously move the gap 203 in the upper and lower directions can be a voluntary method, it is preferable to change the speed of the movement in the upper and lower directions in conjunction with the speed of the movement of the object. For example, it is sufficient that the speed of the movement of the gap 203 in the upper and lower directions is increased when the movement of the object is fast, and the speed of the movement of the gap 203 in the upper and lower directions is reduced when the movement of the object slows down later. When the movement of the object is slow, the speed of the movement of the gap 203 in the upper and lower directions may be increased as in the case where the movement of the object is fast. However, the speed may be reduced to increase the exposure time to gain the signal strength. When the object is still, the speed may also be increased as in the case where the movement of the object is fast. However, the speed of the movement in the upper and lower directions may be further reduced to further increase the exposure time to further gain the signal strength.

The thing included in the gap 203 is not particularly limited as long as the thing can be moved by the variable distance apparatuses 205-1 and 205-2, and a liquid, a solid, a gas such as air, or the like may be included. However, it is preferable that the air be included (so-called air gap). The variable distance apparatuses 205-1 and 205-2 can be piezoelectric devices, such as piezo elements, or MEMS devices.

In a lower layer (lower direction in FIG. 1B) of the variable wavelength device 2000, the solid-state imaging apparatus 200 includes a semiconductor substrate 207 and four photoelectric conversion elements 206 (206-1 to 206-4) formed on the semiconductor substrate 207. Note that although not illustrated, the solid-state imaging apparatus 200 is provided with a wiring layer in a lower layer (lower direction in FIG. 1B) of the semiconductor substrate 207.

In the solid-state imaging apparatus 200, continuous optical spectra can be obtained in a state in which signal reading is not stored, that is, a signal is acquired by current reading. In the case of the current reading, a photocurrent generated by the photoelectric conversion element 206, such as the photodiode (PD) 15 (mainly, depletion layer of PN junction) illustrated in FIG. 3, is read at the same time while the distance d2 of the gap 203 (for example, air gap) is changed. In such a case, the structure and the circuit are as illustrated for example in FIG. 3. For a driving method, a reverse bias may be applied for reading. To further increase the sensitivity, the reverse bias may be increased and applied for avalanche multiplication of a photoelectron generated in the depletion layer in a high electric field state, and the photoelectron may be read as an optical signal.

Although the current value reading has been described, the storage time can also be reduced for instantaneous and fast reading in the reading based on storage to thereby detect pseudo continuous spectra. In this case, a floating diffusion (FD) may be provided as in a normal CMOS image sensor (CIS) to read the voltage signal. In this case, when the measurement is particularly at narrow wavelength intervals of equal to or smaller than a peak-half width, the overlapping of the peaks is sufficiently large, and pseudo continuous optical spectra are obtained as illustrated in FIG. 4 (graph illustrating relationship between peak wavelength intervals and peak half-width). In the pseudo continuous optical spectra acquired by the solid-state imaging apparatus 200, the peak wavelength interval of at least one set of two spectra adjacent to each other is preferably equal to or smaller than the peak half-width. That is, "peak wavelength interval peak half-width" holds. Note that the "peak wavelength interval" denotes the distance between the peaks of arbitrary two spectra adjacent to each other, and the peak half-width denotes the width of the spectrum (wavelength) at 50% of the peak value of each of the two spectra (arbitrary one spectrum).

7. Sixth Embodiment (Example 1 of Electronic Apparatus)

A sixth embodiment (example 1 of electronic apparatus) according to the present technique provides an electronic apparatus including the sensor of the first embodiment, the sensor of the second embodiment, the sensor of the third embodiment, or the sensor of the fourth embodiment according to the present technique. The sensor of the first embodiment, the sensor of the second embodiment, the sensor of the third embodiment, or the sensor of the fourth embodiment according to the present technique is as described above, and the description will not be repeated here. The electronic apparatus of the sixth embodiment according to the present technique includes the sensor with improved reliability and image quality, and the performance of the electronic apparatus of the sixth embodiment according to the present technique can be improved.

8. Seventh Embodiment (Example 2 of Electronic Apparatus)

A seventh embodiment (example 2 of electronic apparatus) according to the present technique provides an electronic apparatus including the solid-state imaging apparatus of the fifth embodiment according to the present technique. The solid-state imaging apparatus of the fifth embodiment according to the present technique is as described above, and the description will not be repeated here. The electronic apparatus of the seventh embodiment according to the present technique includes the solid-state imaging apparatus with improved reliability and image quality, and the performance of the electronic apparatus of the seventh embodiment according to the present technique can be improved.

Figure 21:
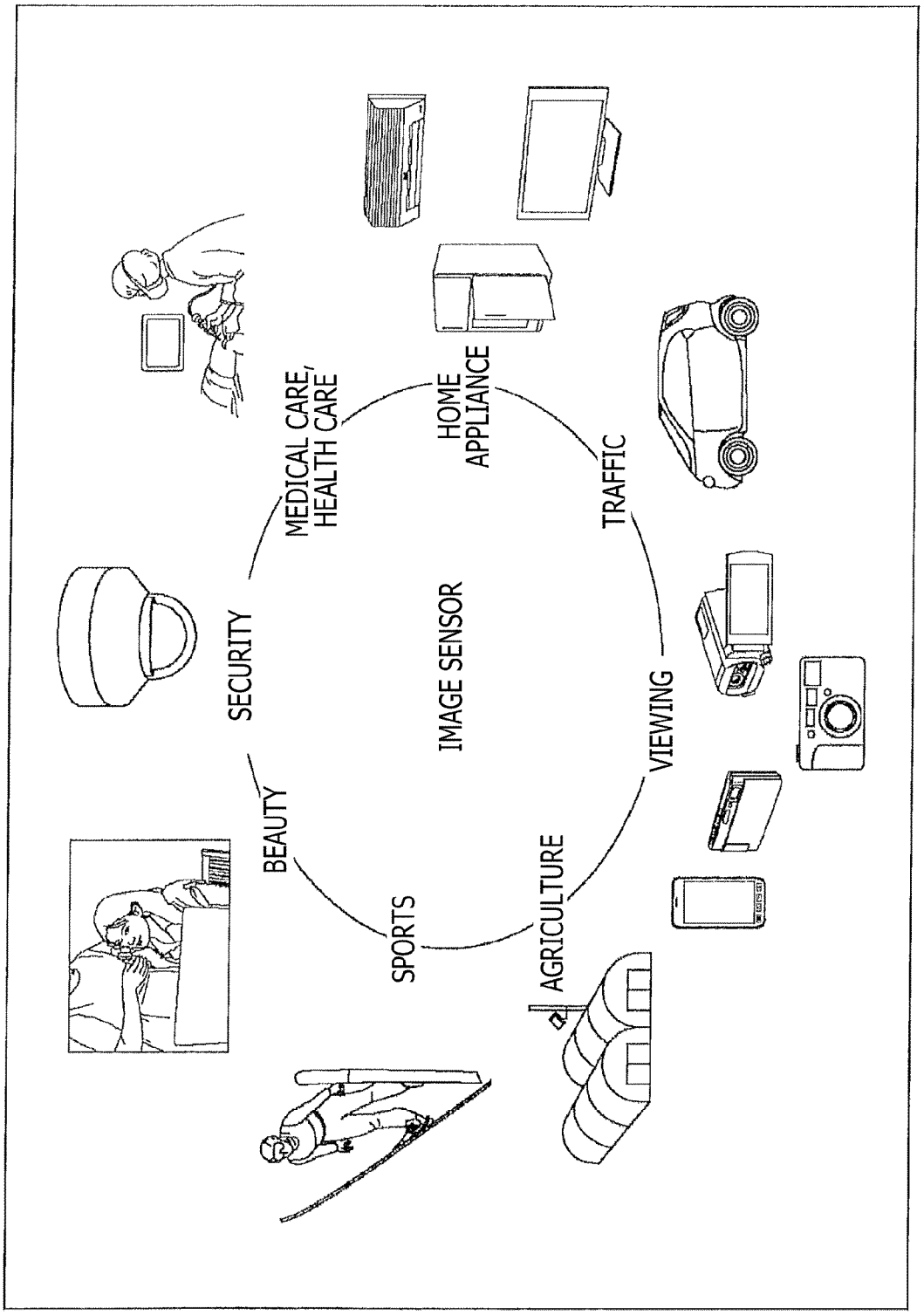
FIG. 21 is a diagram illustrating an example of use of the sensor or the solid-state imaging apparatus according to the present technique.

9. Example of Use of Solid-State Imaging Apparatus According to Present Technique FIG. 21 is a diagram illustrating an example of use of the sensor or the solid-state imaging apparatus according to the present technique. The sensor solid-state imaging apparatus according to the present technique can be used for, for example, various cases of sensing light, such as visible light, infrared light, ultraviolet light, and X rays, as follows.

An apparatus that takes an image to be viewed, such as a digital camera and a mobile device with a camera function.

An apparatus used for traffic, such as an automotive sensor that images front, back, surroundings, and inside of an automobile for safe driving like automatic stop or for recognizing the state of the driver, a monitoring camera that monitors traveling vehicles and roads, and a distance measurement sensor that measures the distance between vehicles and the like.

An apparatus used for a home appliance, such as a TV, a refrigerator, and an air conditioner, to image a gesture of the user to operate the device according to the gesture.

An apparatus used for medical care or health care, such as an endoscope and an apparatus that receives infrared light to image blood vessels.

An apparatus used for security, such as a monitoring camera for crime prevention and a camera for personal authentication.

An apparatus used for beauty, such as a skin measurement device that images the skin and a microscope that images the scalp.

An apparatus used for sports, such as an action camera and a wearable camera for sports and the like.

An apparatus used for agriculture, such as a camera that monitors the state of the farm and crops.

EXAMPLES

Hereinafter, examples will be illustrated to specifically describe advantageous effects of the present technique. Note that the scope of the present technique is not limited to the examples.

Example 1

Figure 8B:
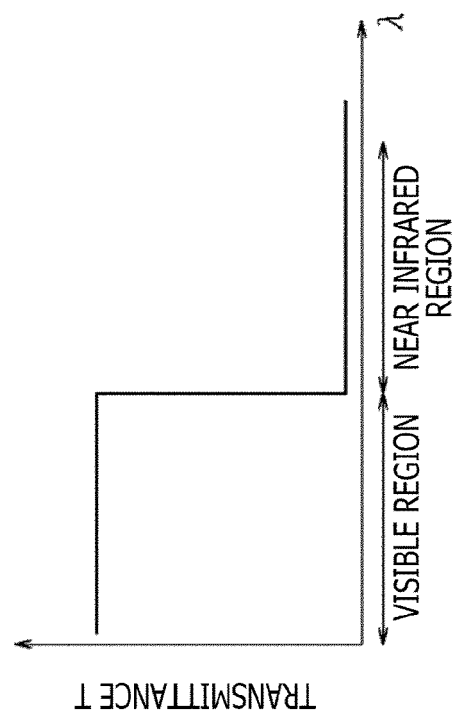
FIGS. 8A and 8B are diagrams illustrating a cross-sectional configuration of a solid-state imaging apparatus of Example 1 according to the present technique and is a diagram illustrating a relationship between transmittance (T) and wavelength (A) when light enters the solid-state imaging apparatus of Example 1.
Figure 8A:
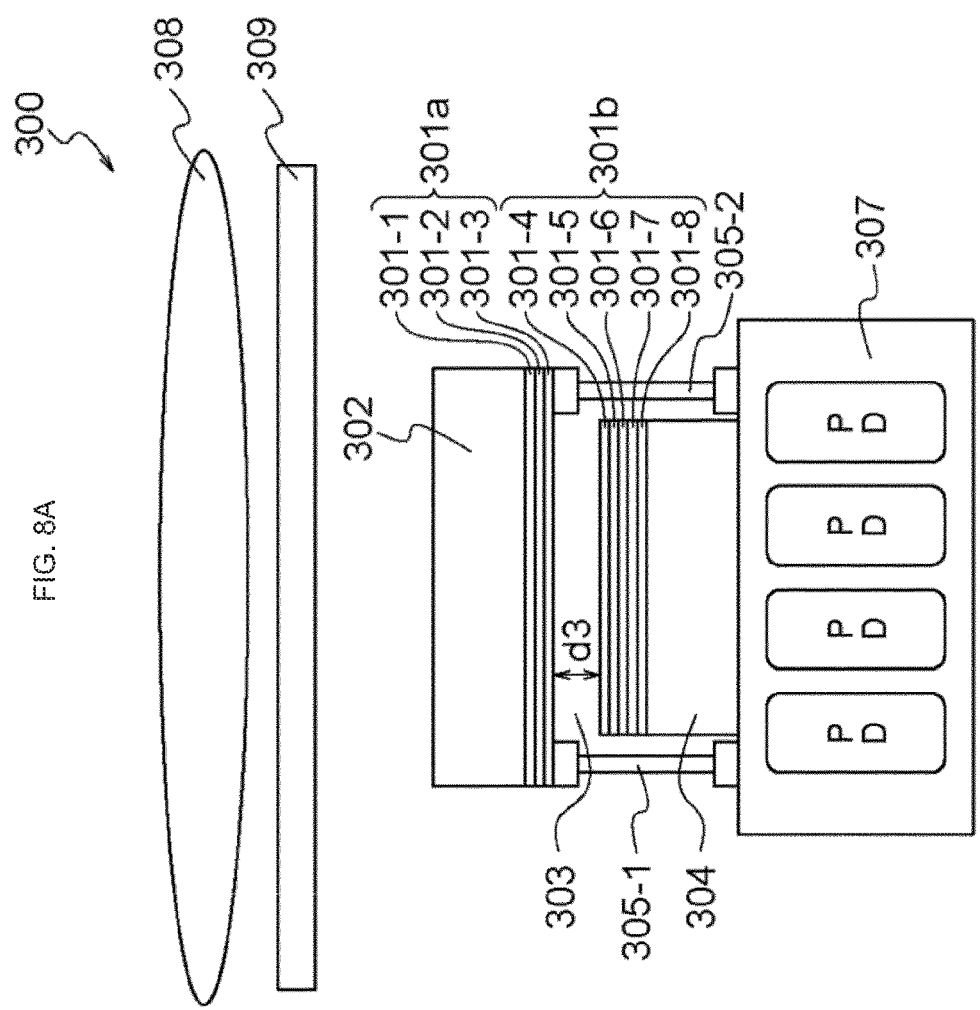

FIG. 8A is a diagram illustrating a cross-sectional configuration of a solid-state imaging apparatus 300 of Example 1. In FIG. 8A, the solid-state imaging apparatus 300 includes one optical element and four photodiodes (PD) in four pixels. FIG. 8B is a graph illustrating a relationship between the transmittance (T) (vertical axis) and the wavelength (A) (horizontal axis) when the light enters the solid-state imaging apparatus 300.

Figure 9:
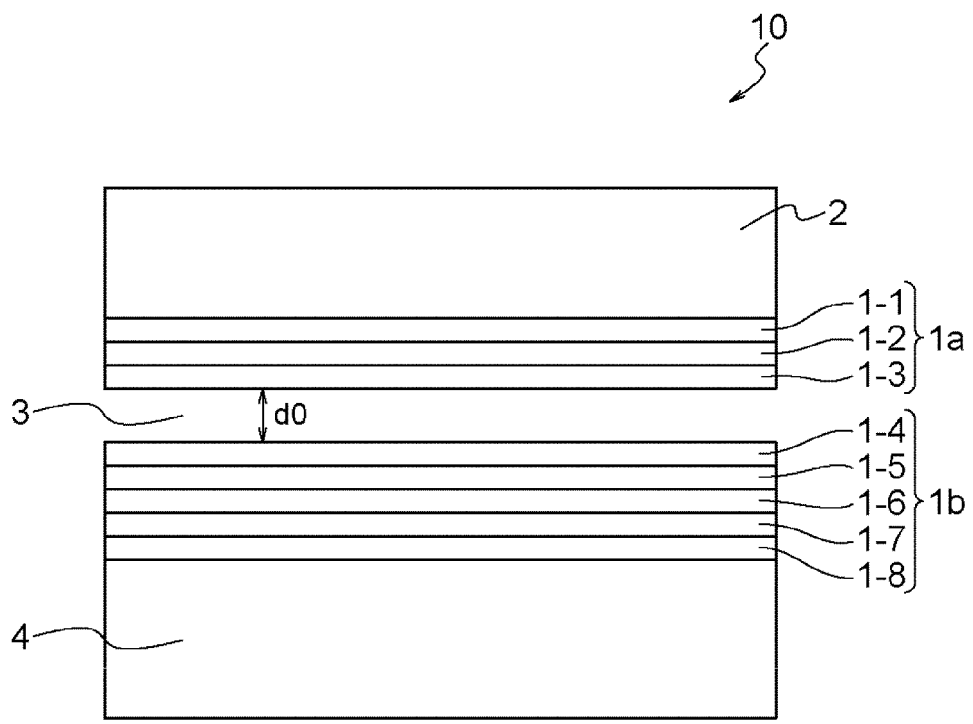
FIG. 9 is a cross-sectional view illustrating a configuration example of a Fabry-Perot resonator included in the sensor or the solid-state imaging apparatus according to the present technique.

The solid-state imaging apparatus 300 includes an optical element including: optical interference filters (also referred to as dielectric multilayer films or reflective multilayer films) 301a (three-layer configuration of 301-1 to 301-3) and 301b (five-layer configuration of 301-4 to 301-8) for spectral diffraction arranged to face each other; an air gap 303 between the dielectric multilayer films 301a and 301b; and substrates 302 and 304. A Fabry-Perot resonator 1 illustrated in FIG. 9 is used as the optical element. FIG. 9 is a diagram schematically illustrating a structure of the Fabry-Perot resonator 1. The Fabry-Perot resonator 1 includes dielectric multilayer films 1a and 1b arranged to face each other, an air gap 3 between the dielectric multilayer films 1a and 1b (air gap distance is d0), and substrates 2 and 4. The dielectric multilayer film 1a has a laminate configuration of three layers including a $TiO_2$ film 1-1, a $SiO_2$ film 1-2, and a $TiO_2$ film 1-3 in order from an upper layer (upper direction in FIG. 9) that is a light incident side. The dielectric multilayer film 1b has a laminate configuration of five layers including a $TiO_2$ film 1-4, a $SiO_2$ film 1-5, a $TiO_2$ film 1-6, a $SiO_2$ film 1-7, and a $TiO_2$ film 1-8 in order from the upper layer (upper direction in FIG. 9) that is the light incident side. In addition, the film thicknesses of the $TiO_2$ film and the $SiO_2$ film of the Fabry-Perot resonator 1 used in the solid-state imaging apparatus 300 of Example 1 are $TiO_2$ film: 46 nm and $SiO_2$ film: 82 nm. Note that other material systems including a material with a high refractive index and a material with a low refractive index, such as a $TaO_2$ film and a $SiO_2$ film or a $Si_3N_4$ film and a $SiO_2$ film, may be used.

A variable wavelength device included in the solid-state imaging apparatus 300 includes the optical element (Fabry-Perot resonator 1) and variable distance apparatuses 305-1 and 305-2. The variable distance apparatuses 305-1 and 305-2 are used in the air gap 303 to change a distance d3 of the air gap 303. The variable distance apparatuses 305-1 and 305-2 can be piezoelectric devices, such as piezo elements, or MEMS devices. In an upper layer (upper direction in FIG. 8A) that is the light incident side, the solid-state imaging apparatus 300 further includes an imaging lens 308 and an IR-cut filter 309 in order from the light incident side. As illustrated in FIG. 8B, the IR-cut filter 309 has a function of cutting light in a near infrared region and transmitting light in a visible light region. Furthermore, in a lower layer (lower direction in FIG. 8A) of the variable wavelength device, the solid-state imaging apparatus 300 includes a semiconductor substrate 307 and four photodiodes (PD) formed on the semiconductor substrate 307. Note that although not illustrated, the solid-state imaging apparatus 300 is provided with a wiring layer in the lower layer (lower direction in FIG. 8A) of the semiconductor substrate 307.

Figure 10:
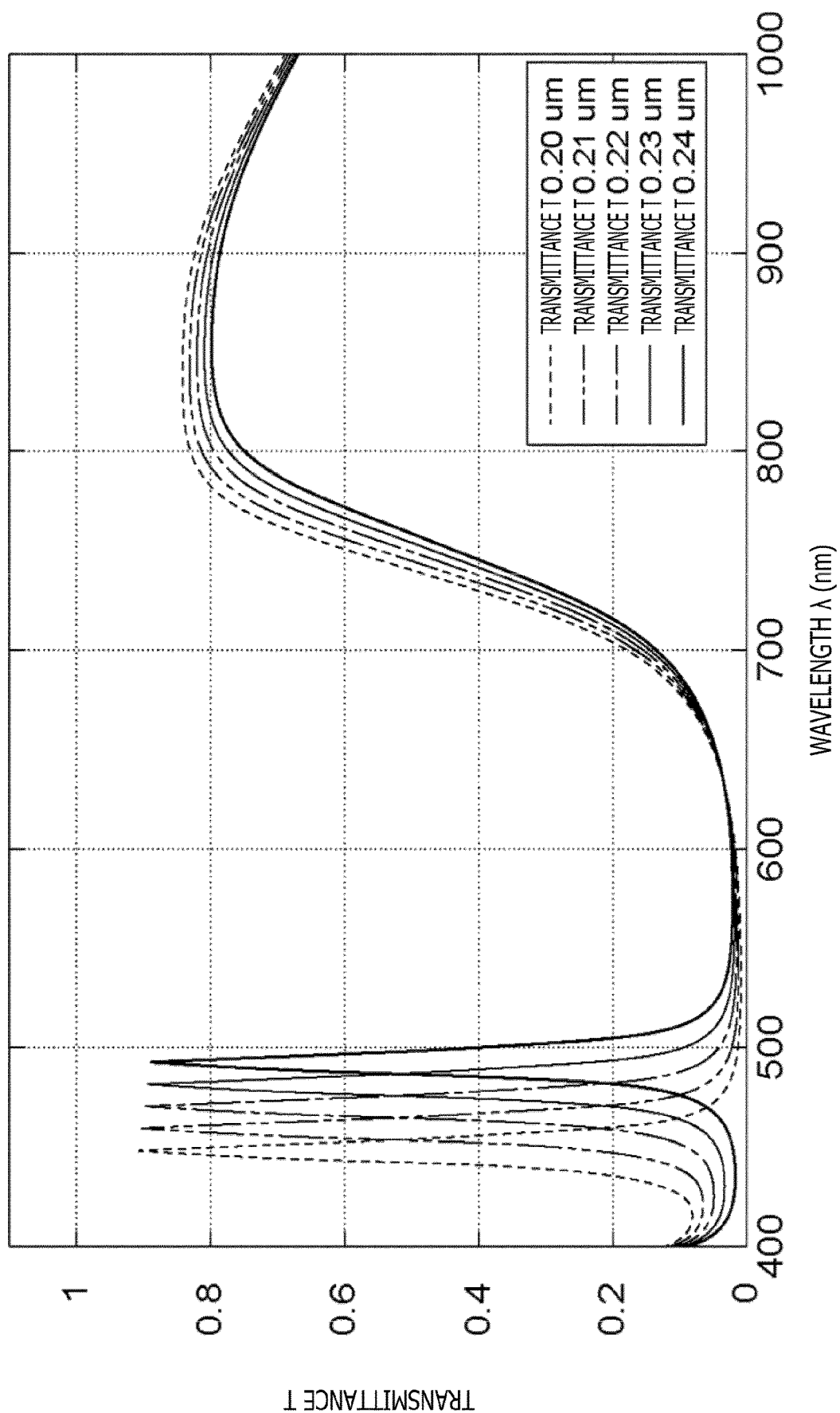
FIG. 10 is a graph illustrating continuous optical spectra acquired by the solid-state imaging apparatus of Example 1 according to the present technique.
Figure 11:
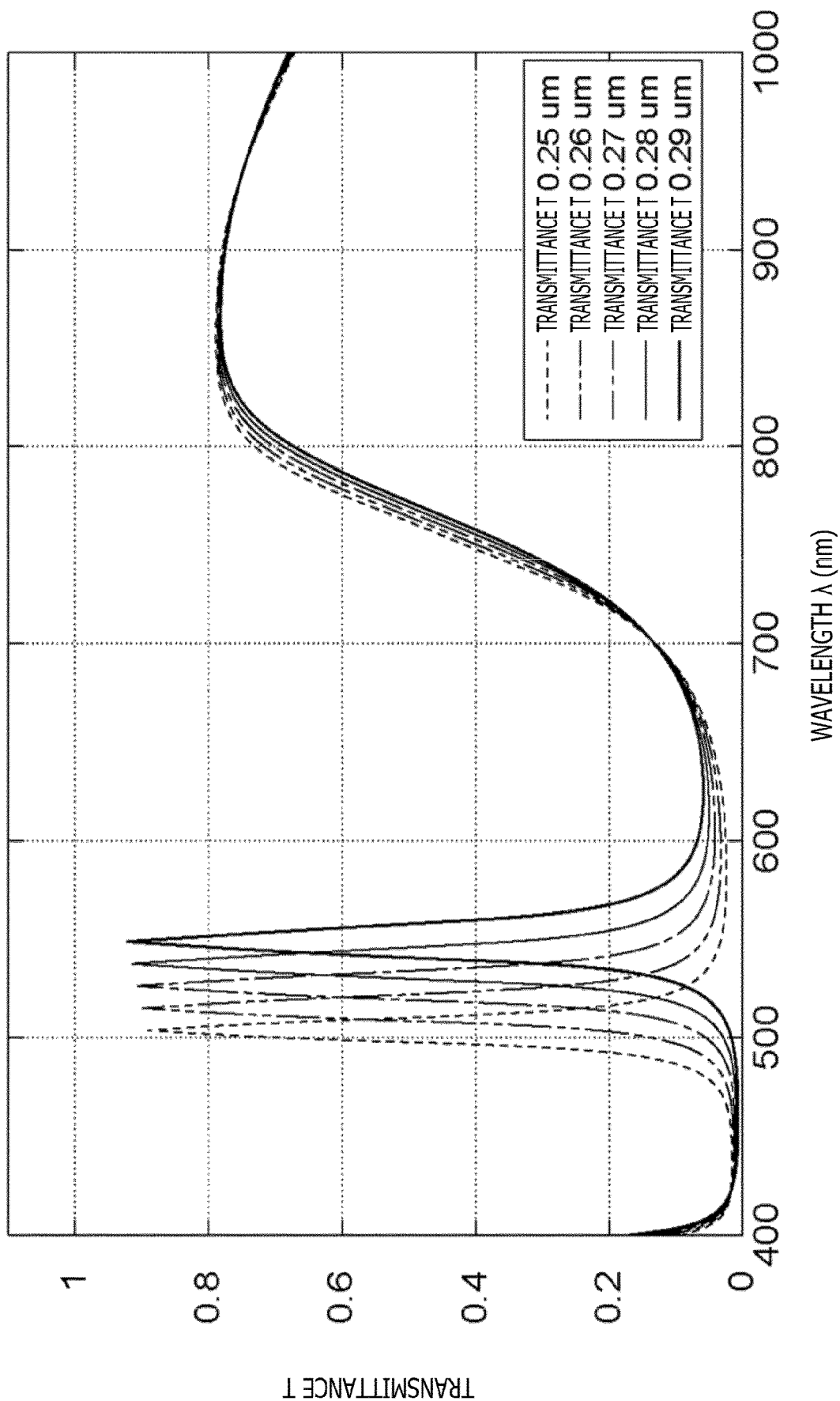
FIG. 11 is a graph illustrating continuous optical spectra acquired by the solid-state imaging apparatus of Example 1 according to the present technique.
Figure 12:
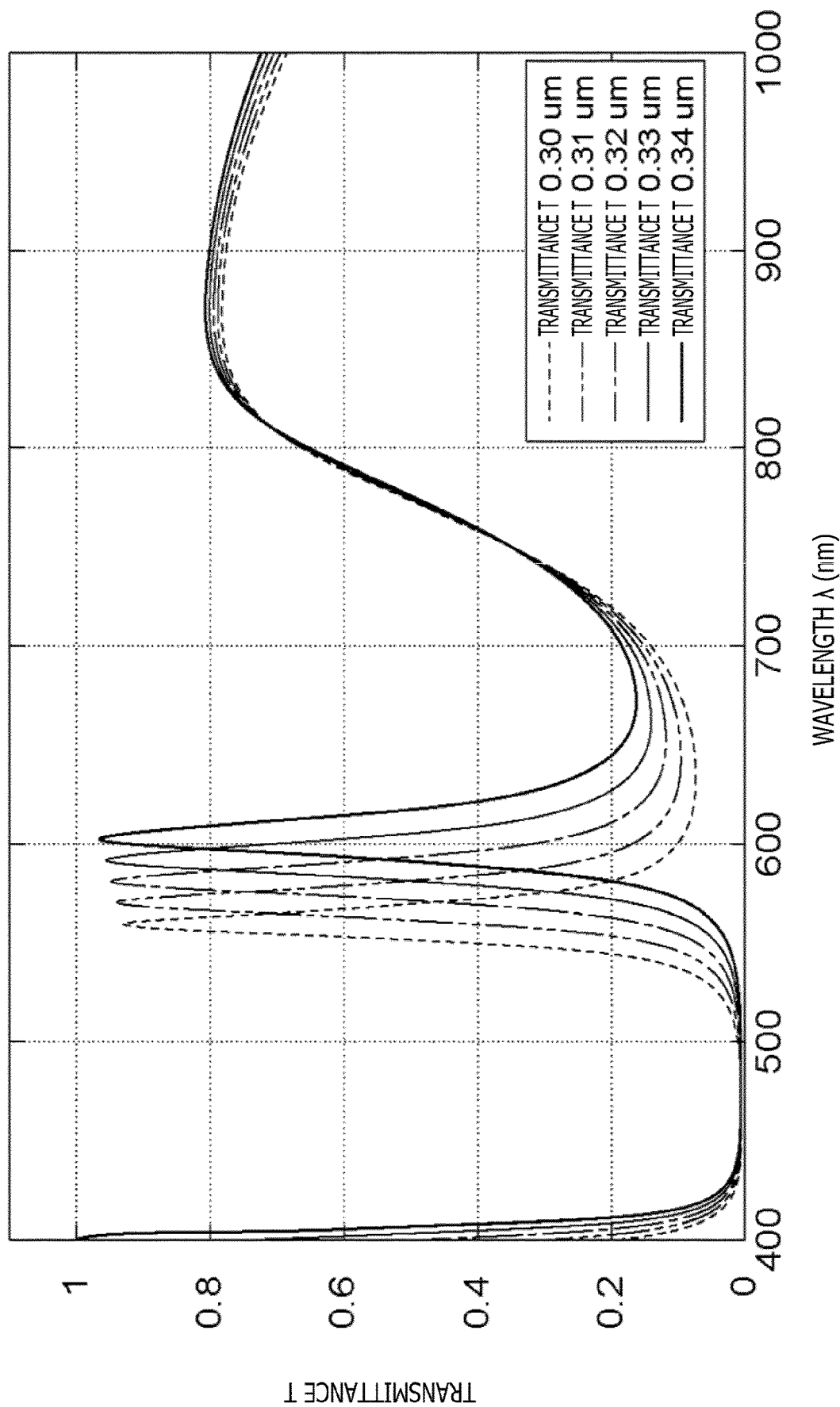
FIG. 12 is a graph illustrating continuous optical spectra acquired by the solid-state imaging apparatus of Example 1 according to the present technique.
Figure 13:
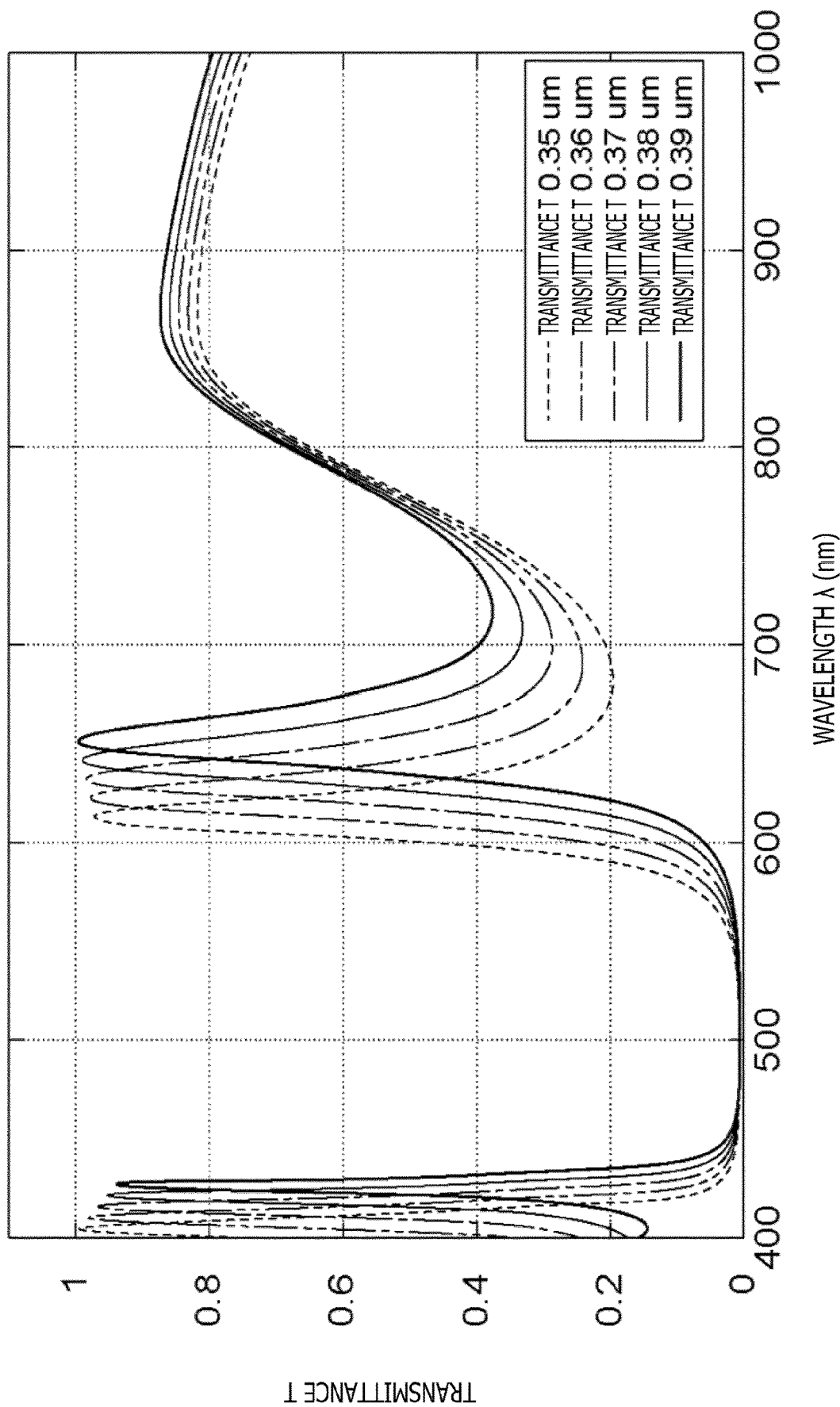
FIG. 13 is a graph illustrating continuous optical spectra acquired by the solid-state imaging apparatus of Example 1 according to the present technique.

FIGS. 10 to 13 illustrate results of transmittance spectra when the distance d3 of the air gap 303 is changed. FIG. 10 illustrates transmittance spectra when the distance d3 of the air gap 303 is changed in a range of 0.2 to 0.24 μm. FIG. 11 illustrates transmittance spectra when the distance d3 of the air gap 303 is changed in a range of 0.25 to 0.29 μm. FIG. 12 illustrates transmittance spectra when the distance d3 of the air gap 303 is changed in a range of 0.30 to 0.34 μm. FIG. 13 illustrates transmittance spectra when the distance d3 of the air gap 303 is changed in a range of 0.35 to 0.39 μm. In addition, FIG. 14 illustrates dependence of the peak wavelength on the distance d3 of the air gap 303. As illustrated in FIG. 14, for example, the peak wavelength $\lambda_0$ is 504 nm when the distance d3 of the air gap 303 is 250 nm. The peak wavelength $\lambda_0$ is 582 nm when the distance d3 of the air gap 303 is 320 nm. The peak wavelength $\lambda_0$ is 661 nm when the distance d3 of the air gap 303 is 400 nm. Therefore, it is found out that the peak wavelength $\lambda_0$ substantially linearly changes from 450 to 660 nm with respect to the change in the distance d3 of the air gap 303 from 200 to 400 nm. Furthermore, the IR-cut filter 309 in the upper layer cuts the light at the wavelengths of 650 nm or higher, and the transmission spectrum has a single peak. Note that although sub peaks appear at 420 nm or lower as illustrated in FIGS. 10 to 13, other filters may cut these wavelength ranges.

The solid-state imaging apparatus 300 uses the pixel structure and the circuit as illustrated in FIG. 3 to read the current while changing the distance d3 of the air gap 303 (distance do of air gap 3 in FIG. 9). As a result, the solid-state imaging apparatus 300 can acquire an image of visible light and acquire continuous optical spectra of visible light. Note that the storage time may also be reduced for instantaneous and fast reading in the reading based on storage to thereby acquire pseudo continuous spectra. In this case, a floating diffusion (FD) may be provided on the solid-state imaging apparatus to read the voltage signal. In this case, it is sufficient that the measurement can be particularly at narrow wavelength intervals of equal to or smaller than the peak-half width.

Example 2

FIG. 15A is a diagram illustrating a cross-sectional configuration of the solid-state imaging apparatus 400 of Example 2. In FIG. 15A, the solid-state imaging apparatus 400 includes one optical element and four photodiodes (PD) in four pixels. FIG. 15B is a graph illustrating a relationship between the transmittance (T) (vertical axis) and the wavelength (λ) (horizontal axis) when the light enters the solid-state imaging apparatus 400.

The solid-state imaging apparatus 400 includes an optical element including: optical interference filters (also referred to as dielectric multilayer films or reflective multilayer films) 401a (three-layer configuration of 401-1 to 401-3) and 401b (five-layer configuration of 401-4 to 401-8) for spectral diffraction arranged to face each other; an air gap 403 between the dielectric multilayer films 401a and 401b; and substrates 402 and 404. The Fabry-Perot resonator 1 illustrated in FIG. 9 is used as the optical element. In addition, the film thicknesses of the $TiO_2$ film and the $SiO_2$ film of the Fabry-Perot resonator 1 used in the solid-state imaging apparatus 400 of Example 2 are $TiO_2$ film: 83 nm and $SiO_2$ film: 150 nm. Note that other material systems including a material with a high refractive index and a material with a low refractive index, such as a $TaO_2$ film and a $SiO_2$ film or a $Si_3N_4$ film and a $SiO_2$ film, may be used.

A variable wavelength device included in the solid-state imaging apparatus 400 includes the optical element (Fabry-Perot resonator 1) and variable distance apparatuses 405-1 and 405-2. The variable distance apparatuses 405-1 and 405-2 are used in the air gap 403 to change a distance d4 of the air gap 403. The variable distance apparatuses 405-1 and 405-2 can be piezoelectric devices, such as piezo elements, or MEMS devices. In an upper layer (upper direction in FIG. 15A) that is the light incident side, the solid-state imaging apparatus 400 further includes an imaging lens 408 and an visible-light-cut filter 409 in order from the light incident side. As illustrated in FIG. 15B, the visible-light-cut filter 409 has a function of cutting light in a visible light region and mainly transmitting light in a near infrared region. Furthermore, in a lower layer (lower direction in FIG. 15A) of the variable wavelength device, the solid-state imaging apparatus 400 includes a semiconductor substrate 407 and four photodiodes (PD) formed on the semiconductor substrate 407. Note that although not illustrated, the solid-state imaging apparatus 400 is provided with a wiring layer in the lower layer (lower direction in FIG. 15A) of the semiconductor substrate 407.

FIG. 2B illustrates results of transmittance spectra when the distance d4 of the air gap 403 is changed. FIG. 2B illustrates transmittance spectra when the distance d4 of the air gap 403 is changed in a range of 0.3 to 0.475 µm. As illustrated in FIG. 2B, it is found out that the peak wavelength λ0 substantially linearly changes from 680 to 900 nm with respect to the change in the distance d4 of the air gap 403 from 0.3 to 0.475 µm. Furthermore, the visible-light-cut filter 409 cuts the light at the wavelengths of 650 nm or lower, and the transmission spectrum has a single peak.

The solid-state imaging apparatus 400 uses the pixel structure and the circuit as illustrated in FIG. 3 to read the current while changing the distance d4 of the air gap 403 (distance d0 of air gap 3 in FIG. 9). As a result, the solid-state imaging apparatus 400 can acquire an image of near infrared light and acquire continuous optical spectra of near infrared light. Note that the storage time may also be reduced for instantaneous and fast reading in the reading based on storage to thereby acquire pseudo continuous spectra. In this case, a floating diffusion (FD) may be provided on the solid-state imaging apparatus to read the voltage signal. In this case, it is sufficient that the measurement can be particularly at narrow wavelength intervals of equal to or smaller than the peak-half width.

Example 3

FIG. 16A is a diagram illustrating a cross-sectional configuration of the solid-state imaging apparatus 500 of Example 3. In FIG. 16A, the solid-state imaging apparatus 500 includes one optical element and four photodiodes (PD) in four pixels. FIG. 16B is a graph illustrating a relationship between the transmittance (T) (vertical axis) and the wavelength (λ) (horizontal axis) when the light enters the solid-state imaging apparatus 500.

The solid-state imaging apparatus 500 includes an optical element including: optical interference filters (also referred to as dielectric multilayer films or reflective multilayer films) 501a (three-layer configuration of 501-1 to 501-3) and 501b (five-layer configuration of 501-4 to 501-8) for spectral diffraction arranged to face each other; an air gap 503 between the dielectric multilayer films 501a and 501b; and substrates 502 and 504. The Fabry-Perot resonator 1 illustrated in FIG. 9 is used as the optical element. In addition, the film thickness of each of the TiO$_2$ film and the SiO$_2$ film of the Fabry-Perot resonator 1 used in the solid-state imaging apparatus 500 of Example 3 is calculated from an expression λ$_1$/(4×n) nm according to a wavelength λ$_1$ in a narrow band. Here, n is a refractive index and is a refractive index of each of the TiO$_2$ film and the SiO$_2$ film. Note that other material systems including a material with a high refractive index and a material with a low refractive index, such as a TaO$_2$ film and a SiO$_2$ film or a Si$_3$N$_4$ film and a SiO$_2$ film, may be used.

A variable wavelength device included in the solid-state imaging apparatus 500 includes the optical element (Fabry-Perot resonator 1) and variable distance apparatuses 505-1 and 505-2. The variable distance apparatuses 505-1 and 505-2 are used in the air gap 503 to change a distance d5 of the air gap 503. The variable distance apparatuses 505-1 and 505-2 can be piezoelectric devices, such as piezo elements, or MEMS devices. In an upper layer (upper direction in FIG. 16A) that is the light incident side, the solid-state imaging apparatus 500 further includes an imaging lens 508 and a bandpass filter 509 in order from the light incident side. As illustrated in FIG. 16, the bandpass filter 509 has a function of transmitting wavelengths of only a narrow band. Furthermore, in a lower layer (lower direction in FIG. 16A) of the variable wavelength device, the solid-state imaging apparatus 500 includes a semiconductor substrate 507 and four photodiodes (PD) formed on the semiconductor substrate 507. Note that although not illustrated, the solid-state imaging apparatus 500 is provided with a wiring layer in the lower layer (lower direction in FIG. 16A) of the semiconductor substrate 507.

The peak wavelength λ$_0$ is substantially linearly changed by changing the distance d5 of the air gap 503. Furthermore, only the wavelength range in the narrow band is transmitted, and the transmission spectrum has a single peak.

The solid-state imaging apparatus 500 uses the pixel structure and the circuit as illustrated in FIG. 3 to read the current while changing the distance d5 of the air gap 503 (distance d0 of air gap 3 in FIG. 9). As a result, the solid-state imaging apparatus 500 can acquire an image of wavelength light in the wavelength range of narrower band in the transmission wavelength region of the bandpass filter 509 and can acquire continuous optical spectra of wavelength light in the wavelength range of narrower band in the transmission wavelength region of the bandpass filter 509. Note that the storage time may also be reduced for instantaneous and fast reading in the reading based on storage to thereby acquire pseudo continuous spectra. In this case, a floating diffusion (FD) may be provided on the solid-state imaging apparatus to read the voltage signal. In this case, it is sufficient that the measurement can be particularly at narrow wavelength intervals of equal to or smaller than the peak-half width.

Example 4

FIG. 17A is a diagram illustrating a cross-sectional configuration of a solid-state imaging apparatus 600 of Example 4. The solid-state imaging apparatus 600 includes one optical element and one photodiode (PD) in one pixel, and four pixels are illustrated in FIG. 17A. FIG. 17B is a diagram illustrating a cross-sectional configuration of a solid-state imaging apparatus 700 of Example 4. The solid-state imaging apparatus 700 includes one optical element and one photodiode (PD) in one pixel, and four pixels are illustrated in FIG. 17B. FIG. 17C is a graph illustrating a relationship between the transmittance (T) (vertical axis) and the wavelength (λ) (horizontal axis) of on-chip color filters (OCCF) of red (R), green (G), and blue (B).

(Solid-State Imaging Apparatus 600)

First, the solid-state imaging apparatus 600 will be described. For the convenience, the pixel on the far right among the four pixels in FIG. 17A will be used in the description except for the on-chip color filters (OCCF) described later.

The solid-state imaging apparatus 600 includes an optical element including, for each pixel: optical interference filters (also referred to as dielectric multilayer films or reflective multilayer films) 601a (three-layer configuration) and 601b (five-layer configuration) for spectral diffraction arranged to face each other; an air gap 603 between the dielectric multilayer films 601a and 601b; and substrates 602 and 604. The Fabry-Perot resonator 1 illustrated in FIG. 9 is used as the optical element. In addition, the film thicknesses of the TiO$_2$ film and the SiO$_2$ film of the Fabry-Perot resonator 1 used in the solid-state imaging apparatus 600 of Example 4 are TiO$_2$ film: 46 nm and SiO$_2$ film: 81 nm. Note that other material systems including a material with a high refractive index and a material with a low refractive index, such as a TaO$_2$ film and a SiO$_2$ film or a Si$_3$N$_4$ film and a SiO$_2$ film, may be used.

A variable wavelength device included in the solid-state imaging apparatus 600 includes, for each pixel, the optical element (Fabry-Perot resonator 1) and variable distance apparatuses 605-1 and 605-2. The variable distance apparatuses 605-1 and 605-2 are used in the air gap 603 to change a distance d6 of the air gap 603. The variable distance apparatuses 605-1 and 605-2 can be piezoelectric devices, such as piezo elements, or MEMS devices. In an upper layer (upper direction in FIG. 17A) that is the light incident side, the solid-state imaging apparatus 600 further includes an imaging lens 608 and an IR-cut filter 609 in order from the light incident side. On-chip color filters (OCCF) 610 (610-1 to 610-4) have a function of dispersing the light in the visible light region, in which the light in the near infrared region is cut by the IR-cut filter 609, into light of red (R), green (G), and blue (B) and transmitting the light as illustrated in FIG. 17C. Furthermore, in a lower layer (lower direction in FIG. 17A) of the variable wavelength device, the solid-state imaging apparatus 600 includes a semiconductor substrate 607 and four photodiodes (PD) formed on the semiconductor substrate 607. Note that although not illustrated, the solid-state imaging apparatus 600 is provided with a wiring layer in the lower layer (lower direction in FIG. 17A) of the semiconductor substrate 607.

For each pixel, the solid-state imaging apparatus 600 includes the on-chip color filter (OCCF) between the optical element (Fabry-Perot resonator 1) and the IR-cut filter 609. A green (G) on-chip color filter (OCCF) 610-1, a red (R) on-chip color filter (OCCF) 610-2, a blue (B) on-chip color filter (OCCF) 610-3, and a green (G) on-chip color filter (OCCF) 610-4 are sequentially arranged from the left side in FIG. 17A. As a result, more detailed continuous spectra can be acquired for the wavelengths of each narrow band of red (R), green (G), and blue (B). The distance d6 of the air gap 603 for each pixel is a movable range corresponding to red (R), green (G), and blue (B). In the solid-state imaging apparatus 600 of Example 4, d6 is 325 to 400 nm in the case of red (R), d6 is 275 to 325 nm in the case of green (G), and d6 is 200 to 275 nm in the case of blue (B). According to the structure, the continuous spectra of the entire wavelength range of visible light can be quickly acquired.

The peak wavelength $\lambda_0$ is substantially linearly changed by changing the distance d6 of the air gap 603. Furthermore, only the wavelength range in the narrow band is transmitted, and the transmission spectrum has a single peak.

The solid-state imaging apparatus 600 uses the pixel structure and the circuit as illustrated in FIG. 3 to read the current while changing the distance d6 of the air gap 603 (distance d0 of air gap 3 in FIG. 9). As a result, the solid-state imaging apparatus 600 can acquire an image of wavelength light in the wavelength range of narrower band in the transmission wavelength regions of the red (R), green (G), and blue (B) on-chip color filters (OCCF) 610 (610-1 to 610-4) and can acquire continuous optical spectra of wavelength light in the wavelength range of narrower band in the transmission wavelength regions of the red (R), green (G), and blue (B) on-chip color filters (OCCF) 610 (610-1 to 610-4). Note that the storage time may also be reduced for instantaneous and fast reading in the reading based on storage to thereby acquire pseudo continuous spectra. In this case, a floating diffusion (FD) may be provided on the solid-state imaging apparatus to read the voltage signal. In this case, it is sufficient that the measurement can be particularly at narrow wavelength intervals of equal to or smaller than the peak-half width.

(Solid-State Imaging Apparatus 700)

The solid-state imaging apparatus 700 will be described.

For the convenience, the pixel on the far right among the four pixels in FIG. 17B will be used in the description except for the on-chip color filters (OCCF) described later.

The solid-state imaging apparatus 700 includes an optical element including, for each pixel: optical interference filters (also referred to as dielectric multilayer films or reflective multilayer films) 701a (three-layer configuration) and 701b (five-layer configuration) for spectral diffraction arranged to face each other; an air gap 703 between the dielectric multilayer films 701a and 701b; and substrates 702 and 704. The Fabry-Perot resonator 1 illustrated in FIG. 9 is used as the optical element. In addition, the film thicknesses of the TiO$_2$ film and the SiO$_2$ film of the Fabry-Perot resonator 1 used in the solid-state imaging apparatus 700 of Example 4 are TiO$_2$ film: 46 nm and SiO$_2$ film: 81 nm. Note that other material systems including a material with a high refractive index and a material with a low refractive index, such as a TaO$_2$ film and a SiO$_2$ film or a Si$_3$N$_4$ film and a SiO$_2$ film, may be used.

A variable wavelength device included in the solid-state imaging apparatus 700 includes, for each pixel, the optical element (Fabry-Perot resonator 1) and variable distance apparatuses 705-1 and 705-2. The variable distance apparatuses 705-1 and 705-2 are used in the air gap 703 to change a distance d7 of the air gap 703. The variable distance apparatuses 705-1 and 705-2 can be piezoelectric devices, such as piezo elements, or MEMS devices. In an upper layer (upper direction in FIG. 17B) that is the light incident side, the solid-state imaging apparatus 700 further includes an imaging lens 708 and an IR-cut filter 709 in order from the light incident side. On-chip color filters (OCCF) 710 (710-1 to 710-4) have a function of dispersing the light in the visible light region, in which the light in the near infrared region is cut by the IR-cut filter 709, into light of red (R), green (G), and blue (B) and transmitting the light as illustrated in FIG. 17C. Furthermore, in a lower layer (lower direction in FIG. 17B) of the variable wavelength device, the solid-state imaging apparatus 700 includes a semiconductor substrate 707 and four photodiodes (PD) formed on the semiconductor substrate 707. Note that although not illustrated, the solid-state imaging apparatus 700 is provided with a wiring layer in the lower layer (lower direction in FIG. 17B) of the semiconductor substrate 707.

For each pixel, the solid-state imaging apparatus 700 includes the on-chip color filter (OCCF) between the optical element (Fabry-Perot resonator 1) and the semiconductor substrate 707 (PD). A green (G) on-chip color filter (OCCF) 710-1, a red (R) on-chip color filter (OCCF) 710-2, a blue (B) on-chip color filter (OCCF) 710-3, and a green (G) on-chip color filter (OCCF) 710-4 are sequentially arranged from the left side in FIG. 17B. As a result, more detailed continuous spectra can be acquired for the wavelengths of each narrow band of red (R), green (G), and blue (B). The distance d7 of the air gap 703 for each pixel is a movable range corresponding to red (R), green (G), and blue (B). In the solid-state imaging apparatus 700 of Example 4, d6 is 325 to 400 nm in the case of red (R), d6 is 275 to 325 nm in the case of green (G), and d6 is 200 to 275 nm in the case of blue (B). According to the structure, the continuous spectra of the entire wavelength range of visible light can be quickly acquired.

The peak wavelength $\lambda_0$ is substantially linearly changed by changing the distance d7 of the air gap 703. Furthermore, only the wavelength range in the narrow band is transmitted, and the transmission spectrum has a single peak.

The solid-state imaging apparatus 700 uses the pixel structure and the circuit as illustrated in FIG. 3 to read the current while changing the distance d7 of the air gap 703 (distance d0 of air gap 3 in FIG. 9). As a result, the solid-state imaging apparatus 700 can acquire an image of wavelength light in the wavelength range of narrower band in the transmission wavelength regions of the red (R), green (G), and blue (B) on-chip color filters (OCCF) 710 (710-1 to 710-4) and can acquire continuous optical spectra of wavelength light in the wavelength range of narrower band in the transmission wavelength regions of the red (R), green (G), and blue (B) on-chip color filters (OCCF) 710 (710-1 to 710-4). Note that the storage time may also be reduced for instantaneous and fast reading in the reading based on storage to thereby acquire pseudo continuous spectra. In this case, a floating diffusion (FD) may be provided on the solid-state imaging apparatus to read the voltage signal. In this case, it is sufficient that the measurement can be particularly at narrow wavelength intervals of equal to or smaller than the peak-half width.

Example 5

FIG. 18A is a diagram illustrating a cross-sectional configuration of a solid-state imaging apparatus 800 of Example 5. FIG. 18B is a diagram illustrating a cross-sectional configuration of a solid-state imaging apparatus 900 of example 4.

(Solid-State Imaging Apparatus 800)

First, the solid-state imaging apparatus 800 will be described.

The solid-state imaging apparatus 800 includes one optical element and one photodiode (PD) in one pixel, and two pixels are illustrated in FIG. 18A. According to the solid-state imaging apparatus 800, optical spectra of separate wavelength ranges can be acquired at the same time, and spectra of a wide wavelength range can be quickly acquired. The structure of the solid-state imaging apparatus 800 can also be applied to the solid-state imaging apparatuses 300 to 700 (Examples 1 to 4).

The solid-state imaging apparatus 800 includes an optical element including: optical interference filters (also referred to as dielectric multilayer films or reflective multilayer films) 801-1a (three-layer configuration of 801-1-1 to 801-1-3) and 801-1b (five-layer configuration of 801-1-4 to 801-1-8) for spectral diffraction arranged to face each other; an air gap 803-1 between the dielectric multilayer films 801-1a and 801-1b; and substrates 802-1 and 804-1. The Fabry-Perot resonator 1 illustrated in FIG. 9 can be used as the optical element (optical element on the left side in FIG. 18A). The solid-state imaging apparatus 800 also includes an optical element including: optical interference filters (also referred to as dielectric multilayer films or reflective multilayer films) 801-2a (three-layer configuration of 801-2-1 to 801-2-3) and 801-2b (five-layer configuration of 801-2-4 to 801-2-8) for spectral diffraction arranged to face each other; an air gap 803-2 between the dielectric multilayer films 801-2a and 801-2b; and substrates 802-2 and 804-2. The Fabry-Perot resonator 1 illustrated in FIG. 9 can be used as the optical element (optical element on the right side in FIG. 18A).

A variable wavelength device included in the solid-state imaging apparatus 800 includes the optical element (Fabry-Perot resonator 1) on the left side in FIG. 18A and variable distance apparatuses 805-1-1 and 805-1-2. In addition, a variable wavelength device included in the solid-state imaging apparatus 800 includes the optical element (Fabry-Perot resonator 1) on the right side in FIG. 18A and variable distance apparatuses 805-2-1 and 805-2-2. That is, the solid-state imaging apparatus 800 includes the variable wavelength device for each pixel, and therefore, the solid-state imaging apparatus 800 includes two variable wavelength devices for two pixels in FIG. 18A.

The variable distance apparatuses 805-1-1 and 805-1-2 can be used to change a distance d8-1 of the air gap 803-1 in the air gap 803-1 on the left side in FIG. 18A. In addition, the variable distance apparatuses 805-2-1 and 805-2-2 can be used to change a distance d8-2 of the air gap 803-2 in the air gap 803-2 on the right side in FIG. 18A. The variable distance apparatuses 805-1-1, 805-1-2, 805-2-1, and 805-2-2 can be piezoelectric devices, such as piezo elements, or MEMS devices.

In a lower layer (lower direction in FIG. 18A) of the variable wavelength devices, the solid-state imaging apparatus 800 includes, for every two pixels: semiconductor substrates 807-1 and 807-2; and a total of two photodiodes (PD) formed on the semiconductor substrates 807-1 and 807-2, respectively. Note that although not illustrated, the solid-state imaging apparatus 800 is provided with a wiring layer in the lower layer (lower direction in FIG. 18A) of the semiconductor substrates 807 (807-1 and 807-2).

(Solid-State Imaging Apparatus 900)

The solid-state imaging apparatus 900 will be described.

The solid-state imaging apparatus 900 includes one optical element and a plurality of photodiodes (PD) in a plurality of pixels. In FIG. 18B, the solid-state imaging apparatus 900 includes one optical element and four photodiodes (PD) in four pixels. According to the solid-state imaging apparatus 900, optical spectra at the same wavelength can be acquired, and the resolution of the image can be increased. The structure of the solid-state imaging apparatus 900 can also be applied to the solid-state imaging apparatuses 300 to 700 (Examples 1 to 4).

The solid-state imaging apparatus 900 includes an optical element including: optical interference filters (also referred to as dielectric multilayer films or reflective multilayer films) 901a (three-layer configuration of 901-1 to 901-3) and 901b (five-layer configuration of 901-4 to 901-8) for spectral diffraction arranged to face each other; an air gap 903 between the dielectric multilayer films 901a and 901b; and substrates 902 and 904. The Fabry-Perot resonator 1 illustrated in FIG. 9 can be used as the optical element.

A variable wavelength device included in the solid-state imaging apparatus 900 includes the optical element (Fabry-Perot resonator 1) and variable distance apparatuses 905-1 and 905-2.

In the air gap 903, the variable distance apparatuses 905-1 and 905-2 can be used to change a distance d9 of the air gap 903. The variable distance apparatuses 905-1 and 905-2 can be piezoelectric devices, such as piezo elements, and MEMS devices.

In a lower layer of the variable wavelength device (lower direction in FIG. 18B), the solid-state imaging apparatus 900 includes, for every plurality of pixels (four pixels), a semiconductor substrate 907 and four photodiodes (PD) formed on the semiconductor substrate 907. Note that although not illustrated, the solid-state imaging apparatus 900 is provided with a wiring layer in the lower layer (lower direction in FIG. 18B) of the semiconductor substrate 907.

Example 6

Figure 19:
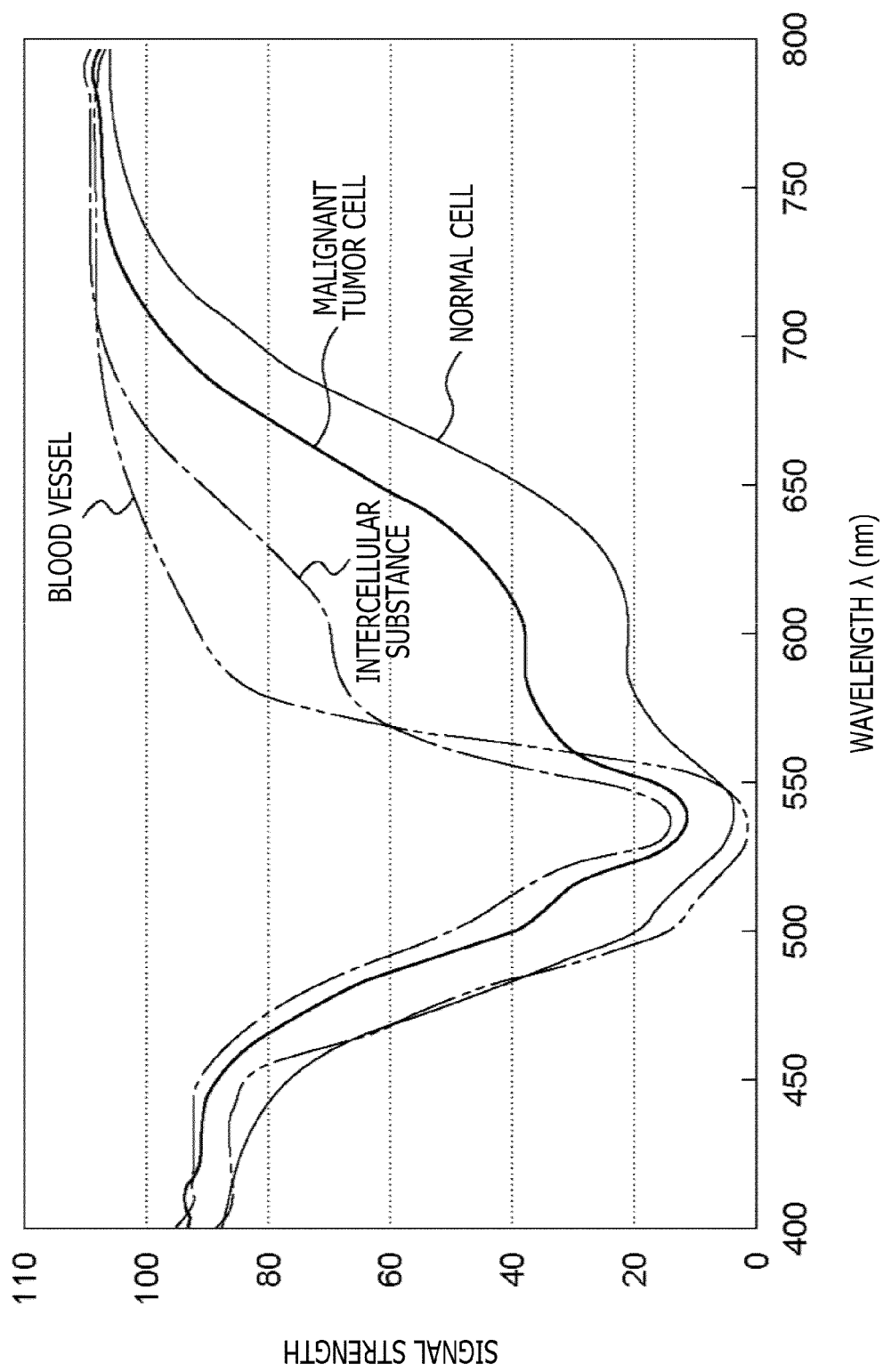
FIG. 19 is a graph illustrating results of continuous optical spectra obtained by a tumor test of Example 6 (application for medical care) according to the present technique.

In this Example, an example of an application of continuous spectra for image will be described. FIG. 19 is a graph illustrating results of continuous optical spectra obtained by a tumor test in an application for medical care. The vertical axis indicates the signal strength, and the horizontal axis indicates the wavelength A (nm). As illustrated in FIG. 19, in the determination of tumor, the sensor or the solid-state imaging apparatus according to the present technique is used for the reflected light of cell surface along with an image of tumor to thereby acquire continuous optical spectra to enable the determination with higher accuracy. As illustrated in FIG. 19, the shapes of the continuous spectra of normal cells, tumor cells, intercellular substances, and blood vessels are different in a range of wavelengths of 550 to 800 nm. The continuous spectra in the detailed shapes can be acquired, and images can also be acquired at the same time to accurately decide which part of the cells is abnormal. This leads to correct determination of treatment.

Figure 20A:
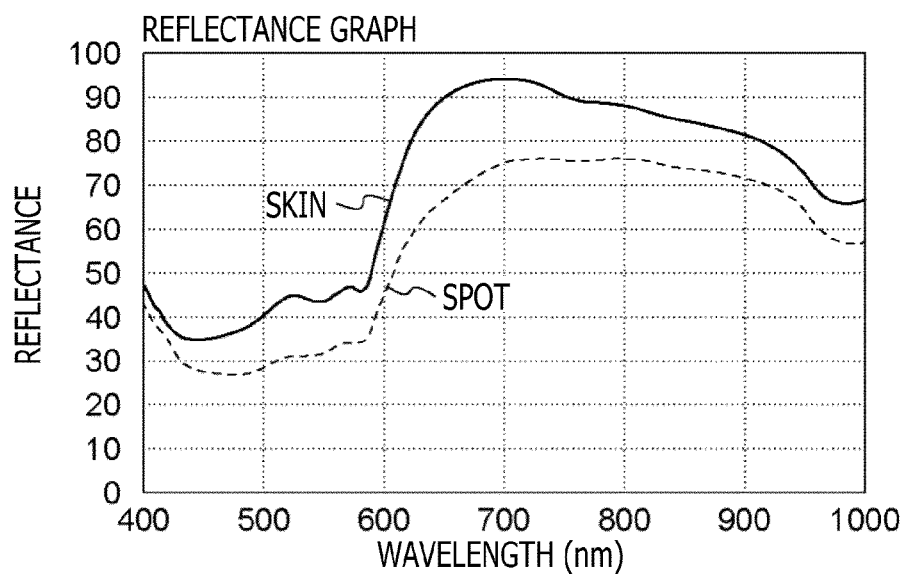
FIGS. 20A, 20B, and 20C are graphs illustrating results of continuous optical spectra obtained by a spot test, a scalp test, and a moisturization test of hair of Example 6 (application for beauty) according to the present technique.
Figure 20B:
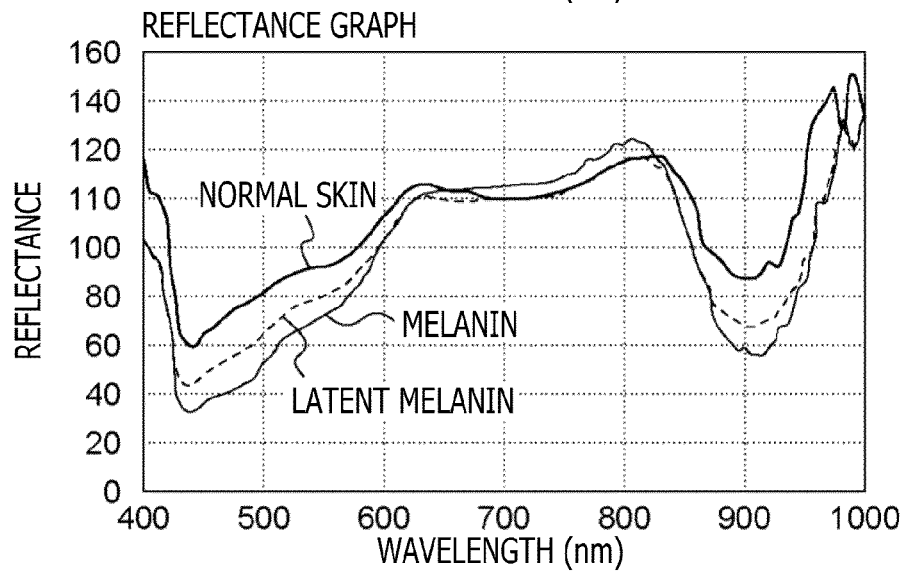
Figure 20C:
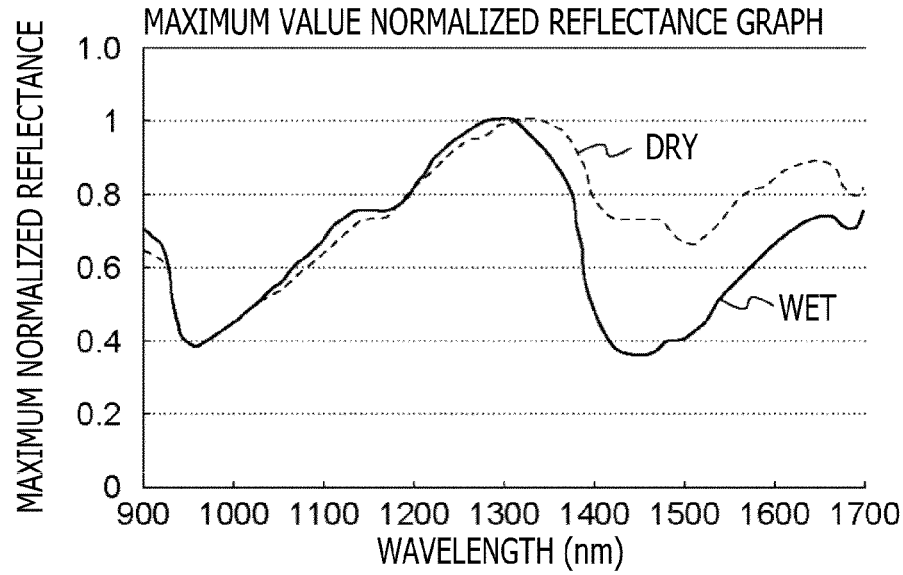

Furthermore, an application of continuous optical spectra for beauty will be described with reference to FIGS. 20A, 20B, and 20C. FIG. 20A is a graph illustrating results of continuous optical spectra obtained by a spot test in an application for beauty. The vertical axis indicates the reflectance, and the horizontal axis indicates the wavelength A (nm). FIG. 20B is a graph indicating results of continuous optical spectra obtained by a scalp test in an application for beauty. The vertical axis indicates the reflectance, and the horizontal axis indicates the wavelength $\lambda$(nm). FIG. 20C is a graph indicating results of continuous optical spectra obtained by a moisture test of hair in an application for beauty. The vertical axis indicates the maximum normalized reflectance, and the horizontal axis indicates the wavelength $\lambda$(nm). Note that the sensor or the solid-state imaging apparatus according to the present technique is used to acquire the continuous optical spectra in the spot test, the scalp test, and the moisturization test of hair.

As illustrated in FIG. 20A, the shapes of the reflectance spectra of light from the surface significantly vary between a normal skin section and a spot section in the spot test, and the continuous optical spectra can be acquired to decide the locations of the spots. Particularly, the shapes of the continuous optical spectra at the wavelengths of 450 to 900 nm and the image of the spots can be acquired to allow the decision.

Similarly, as illustrated in FIG. 20B, the shapes of the reflectance spectra of light from normal skin, latent melanin, and melanin vary in the scalp test, and the continuous optical spectra can be acquired to recognize the parts of the melanin and the latent melanin. Particularly, the determination can be made based on the shapes of the continuous optical spectra at the wavelengths of 400 to 600 nm and the wavelengths of 800 to 1000 nm and the image of the scalp.

Furthermore, the moist state of hair can be similarly tested. As illustrated in FIG. 20C, the determination can be particularly made based on the shapes of the continuous optical spectra at the wavelengths of 1300 to 1700 nm and the image of hair.

In this way, the continuous optical spectra and appropriate images can be acquired to figure out the states of the skin, the scalp, the hair, and the like for beauty, and measures can be taken.

Note that the present technique is not limited to the embodiments and Examples, and various changes can be made without departing from the scope of the present technique.

In addition, regarding the advantageous effects of the present technique, the advantageous effects described in the present specification are illustrative only and are not limited. There may also be other advantageous effects.

In addition, the present technique can also be configured as follows.

[1]
A sensor including:
at least one variable wavelength device including
an optical element including at least two optical interference filters, the at least two optical interference filters arranged to face each other, the optical element having a gap between the at least two optical interference filters arranged to face each other, and
a variable distance apparatus that changes a distance of the gap; and
at least one photoelectric conversion element, in which
the distance of the gap is changed to acquire continuous optical spectra.

[2]
The sensor according to [1], in which
in the continuous optical spectra, a peak wavelength interval of at least one set of two spectra adjacent to each other is equal to or smaller than a peak half-width.

[3]
The sensor according to [1] or [2], in which
the optical element includes a Fabry-Perot resonator.

[4]
The sensor according to any one of [1] to [3], in which
the gap includes an air gap.

[5]
The sensor according to any one of [1] to [4], in which
the variable distance apparatus includes a piezoelectric device or a MEMS device.

[6]
The sensor according to any one of [1] to [5], in which
a light charge signal is continuously read in conjunction with the change in the distance of the gap.

[7]
The sensor according to any one of [1] to [5], in which
a light charge signal is continuously read through a current in conjunction with the change in the distance of the gap.

[8]
The sensor according to any one of [1] to [7], further including:
at least one filter that transmits light in a specific wavelength band in incident light.

[9]
A sensor including:
at least one variable wavelength device including
an optical element including at least two optical interference filters, the at least two optical interference filters arranged to face each other, the optical element having a gap between the at least two optical interference filters arranged to face each other, and
a variable distance apparatus that changes a distance of the gap;
a first semiconductor substrate;

a second semiconductor substrate;
at least one photodiode formed on the first semiconductor substrate, the photodiode including a light receiving surface on a second main surface side of the first semiconductor substrate;
a floating diffusion formed on a surface of a first main surface of the first semiconductor substrate;
a first transistor formed on the first main surface of the first semiconductor substrate;
a first wiring layer formed on the first main surface of the first semiconductor substrate;
a first electrode exposed on a surface of the first wiring layer;
a second transistor formed on a first main surface of the second semiconductor substrate;
a second wiring layer formed on the first main surface of the second semiconductor substrate;
a second electrode exposed on a surface of the second wiring layer; and
a floating diffusion wire that connects the floating diffusion and a gate electrode of the second transistor through the first electrode and the second electrode, in which
the first electrode and the second electrode are joined, the first semiconductor substrate and the second semiconductor substrate are pasted together, and
the distance of the gap is changed to acquire continuous optical spectra.

[10]
The sensor according to [9], in which
in the continuous optical spectra, a peak wavelength interval of at least one set of two spectra adjacent to each other is equal to or smaller than a peak half-width.

[11]
The sensor according to [9] or [10], in which
the optical element includes a Fabry-Perot resonator.

[12]
The sensor according to any one of [9] to [11], in which
the gap includes an air gap.

[13]
The sensor according to any one of [9] to [12], in which
the variable distance apparatus includes a piezoelectric device or a MEMS device.

[14]
The sensor according to any one of [9] to [13], in which
a light charge signal is continuously read in conjunction with the change in the distance of the gap.

[15]
The sensor according to any one of [9] to [14], further including:
at least one filter that transmits light in a specific wavelength band in incident light.

[16]
A sensor including:
at least one variable wavelength device including
an optical element including at least two optical interference filters, the at least two optical interference filters arranged to face each other, the optical element having a gap between the at least two optical interference filters arranged to face each other, and
a variable distance apparatus that changes a distance of the gap;
a first semiconductor substrate; a second semiconductor substrate;
at least one photodiode formed on the first semiconductor substrate, the photodiode including a light receiving surface on a second main surface side of the first semiconductor substrate;
a first transistor formed on the first main surface of the first semiconductor substrate;
a first wiring layer formed on the first main surface of the first semiconductor substrate;
a first electrode exposed on a surface of the first wiring layer;
a second transistor formed on a first main surface of the second semiconductor substrate;
a second wiring layer formed on the first main surface of the second semiconductor substrate;
a second electrode exposed on a surface of the second wiring layer; and
a current reading wire that connects a third electrode of the at least one photodiode and a gate electrode of the second transistor through the first electrode and the second electrode, in which
the first electrode and the second electrode are joined, the first semiconductor substrate and the second semiconductor substrate are pasted together, and
the distance of the gap is changed to acquire continuous optical spectra.

[17]
The sensor according to [16], in which
in the continuous optical spectra, a peak wavelength interval of at least one set of two spectra adjacent to each other is equal to or smaller than a peak half-width.

[18]
The sensor according to [16] or [17], in which
the optical element includes a Fabry-Perot resonator.

[19]
The sensor according to any one of [16] to [18], in which
the gap includes an air gap.

[20]
The sensor according to any one of [16] to [19], in which
the variable distance apparatus includes a piezoelectric device or a MEMS device.

[21]
The sensor according to any one of [16] to [20], in which
a light charge signal is continuously read in conjunction with the change in the distance of the gap.

[22]
The sensor according to any one of [16] to [20], in which
a light charge signal is continuously read through a current in conjunction with the change in the distance of the gap.

[23]
The sensor according to any one of [16] to [22], further including:
at least one filter that transmits light in a specific wavelength band in incident light.

[24]
A solid-state imaging apparatus including:
at least one sensor according to any one of [1] to [23], in which
a plurality of pixels is one-dimensionally or two-dimensionally arranged.

[25]
An electronic apparatus including:
the sensor according to any one of [1] to [23].

[26]
An electronic apparatus including:
the solid-state imaging apparatus according to [24].

REFERENCE SIGNS LIST 1 (1a, 1b), 101 (101a, 101b), 201 (201a, 201b), 301 (301a, 301b), 401 (401a, 401b), 501 (501a, 501b), 601

(601a, 601b), 701 (701a, 701b), 801 (801a, 801b), 901 (901a, 901b) . . . Optical interference filter,
10 . . . Fabry-Perot resonator (optical element),
105 (105-1, 105-2), 205 (205-1, 205-2), 305 (305-1, 305-2), 405 (405-1, 405-2), 505 (505-1, 505-2), 605 (605-1, 605-2), 705 (705-1, 705-2) . . . Variable distance apparatus,
d0 to d9 . . . (Air) gap distance,
150, 250 . . . Optical element,
1000, 2000 . . . Variable wavelength device,
106, 206 (206-1 to 206-4) . . . Photoelectric conversion element,
100 . . . Sensor,
200, 300, 400, 500, 600, 700, 800, 900 . . . Solid-state imaging apparatus.

The invention claimed is:

1. A sensor, comprising:
at least one variable wavelength device including:
an optical element configured to image an object, wherein the optical element includes:
a first optical interference filter;
a second optical interference filter that faces the first optical interference filter, wherein
each of the first optical interference filter and the second optical interference filter is a multilayer film,
a film thickness of a first layer of the multilayer film is different from a film thickness of a second layer of the multilayer film, and
the first layer is adjacent to the second layer; and
a gap between the first optical interference filter and the second optical interference filter; and
a variable distance apparatus configured to change a distance of the gap based on a speed of movement of the object; and
at least one photoelectric conversion element, wherein the distance of the gap is changed to acquire continuous optical spectra.

2. The sensor according to claim 1, wherein
in the continuous optical spectra, a peak wavelength interval of at least one set of two spectra is equal to or smaller than a peak half-width, and
a first spectra of the at least one set of two spectra is adjacent to a second spectra of the at least one set of two spectra.

3. The sensor according to claim 1, wherein the optical element further includes a Fabry-Perot resonator.

4. The sensor according to claim 1, wherein the gap includes an air gap.

5. The sensor according to claim 1, wherein the variable distance apparatus includes one of a piezoelectric device or a MEMS device.

6. The sensor according to claim 1, wherein a light charge signal is continuously read in conjunction with the change in the distance of the gap.

7. The sensor according to claim 1, wherein a light charge signal is continuously read through a current in conjunction with the change in the distance of the gap.

8. The sensor according to claim 1, further comprising at least one filter configured to transmit light in a specific wavelength band in incident light.

9. A sensor, comprising:
at least one variable wavelength device including:
an optical element configured to image an object, wherein the optical element includes:
a first optical interference filter;
a second optical interference filter that faces the first optical interference filter, wherein
each of the first optical interference filter and the second optical interference filter is a multilayer film,
a film thickness of a first layer of the multilayer film is different from a film thickness of a second layer of the multilayer film, and
the first layer is adjacent to the second layer; and
a gap between the first optical interference filter and the second optical interference filter; and
a variable distance apparatus configured to change a distance of the gap based on a speed of movement of the object;
a first semiconductor substrate;
a second semiconductor substrate;
at least one photodiode on the first semiconductor substrate, wherein the at least one photodiode includes a light receiving surface on a first main surface of the first semiconductor substrate;
a floating diffusion on a surface of a second main surface of the first semiconductor substrate, wherein the second main surface is opposite to the first main surface;
a first transistor on the second main surface of the first semiconductor substrate;
a first wiring layer on the second main surface of the first semiconductor substrate;
a first electrode on a surface of the first wiring layer;
a second transistor on a surface of the second semiconductor substrate;
a second wiring layer on the surface of the second semiconductor substrate;
a second electrode on a surface of the second wiring layer; and
a floating diffusion wire that connects the floating diffusion and a gate electrode of the second transistor through the first electrode and the second electrode, wherein
the first electrode and the second electrode are joined,
the first semiconductor substrate and the second semiconductor substrate are pasted together, and
the distance of the gap is changed to acquire continuous optical spectra.

10. A sensor, comprising:
at least one variable wavelength device including:
an optical element configured to image an object, wherein the optical element includes:
a first optical interference filter;
a second optical interference filter that faces the first optical interference filter, wherein
each of the first optical interference filter and the second optical interference filter is a multilayer film,
a film thickness of a first layer of the multilayer film is different from a film thickness of a second layer of the multilayer film, and
the first layer is adjacent to the second layer; and
a gap between the first optical interference filter and the second optical interference filter; and
a variable distance apparatus configured to change a distance of the gap based on a speed of movement of the object;
a first semiconductor substrate;
a second semiconductor substrate;

at least one photodiode on the first semiconductor substrate, wherein the at least one photodiode includes a light receiving surface on a first main surface of the first semiconductor substrate;
a first transistor on a second main surface of the first semiconductor substrate, wherein the second main surface is opposite to the first main surface;
a first wiring layer on the second main surface of the first semiconductor substrate;
a first electrode on a surface of the first wiring layer;
a second transistor on a surface of the second semiconductor substrate;
a second wiring layer on the surface of the second semiconductor substrate;
a second electrode on a surface of the second wiring layer; and
a current reading wire that connects a third electrode of the at least one photodiode and a gate electrode of the second transistor through the first electrode and the second electrode, wherein
the first electrode and the second electrode are joined,
the first semiconductor substrate and the second semiconductor substrate are pasted together, and
the distance of the gap is changed to acquire continuous optical spectra.

11. A solid-state imaging apparatus, comprising:
a plurality of pixels arranged one-dimensionally or two-dimensionally, wherein the plurality of pixels comprises a sensor that includes:
at least one variable wavelength device including:
an optical element configured to image an object, wherein the optical element includes:
a first optical interference filter;
a second optical interference filter that faces the first optical interference filter, wherein
each of the first optical interference filter and the second optical interference filter is a multilayer film,
a film thickness of a first layer of the multilayer film is different from a film thickness of a second layer of the multilayer film, and
the first layer is adjacent to the second layer; and
a gap between the first optical interference filter and the second optical interference filter; and
a variable distance apparatus configured to change a distance of the gap based on a speed of movement of the object; and
at least one photoelectric conversion element, wherein the distance of the gap is changed to acquire continuous optical spectra.

12. A solid-state imaging apparatus, comprising:
a plurality of pixels arranged one-dimensionally or two-dimensionally, wherein the plurality of pixels comprises a sensor that includes:
at least one variable wavelength device including:
an optical element configured to image an object, wherein the optical element includes:
a first optical interference filter;
a second optical interference filter that faces the first optical interference filter, wherein
each of the first optical interference filter and the second optical interference filter is a multilayer film,
a film thickness of a first layer of the multilayer film is different from a film thickness of a second layer of the multilayer film, and
the first layer is adjacent to the second layer; and
a gap between the first optical interference filter and the second optical interference filter; and
a variable distance apparatus configured to change a distance of the gap based on a speed of movement of the object;
a first semiconductor substrate;
a second semiconductor substrate;
at least one photodiode on the first semiconductor substrate, wherein the at least one photodiode includes a light receiving surface on a first main surface of the first semiconductor substrate;
a floating diffusion on a surface of a second main surface of the first semiconductor substrate, wherein the second main surface is opposite to the first main surface;
a first transistor on the second main surface of the first semiconductor substrate;
a first wiring layer on the second main surface of the first semiconductor substrate;
a first electrode on a surface of the first wiring layer;
a second transistor on a surface of the second semiconductor substrate;
a second wiring layer on the surface of the second semiconductor substrate;
a second electrode on a surface of the second wiring layer; and
a floating diffusion wire that connects the floating diffusion and a gate electrode of the second transistor through the first electrode and the second electrode, wherein
the first electrode and the second electrode are joined,
the first semiconductor substrate and the second semiconductor substrate are pasted together, and
the distance of the gap is changed to acquire continuous optical spectra.

13. A solid-state imaging apparatus, comprising:
a plurality of pixels arranged one-dimensionally or two-dimensionally, wherein the plurality of pixels comprises a sensor that includes:
at least one variable wavelength device including:
an optical element configured to image an object, wherein the optical element includes:
a first optical interference filter;
a second optical interference filter that faces the first optical interference filter, wherein
each of the first optical interference filter and the second optical interference filter is a multilayer film,
a film thickness of a first layer of the multilayer film is different from a film thickness of a second layer of the multilayer film, and
the first layer is adjacent to the second layer; and
a gap between the first optical interference filter and the second optical interference filter; and
a variable distance apparatus configured to change a distance of the gap based on a speed of movement of the object;
a first semiconductor substrate;
a second semiconductor substrate;
at least one photodiode on the first semiconductor substrate, wherein the at least one photodiode includes a light receiving surface on a first main surface of the first semiconductor substrate;

a first transistor on a second main surface of the first semiconductor substrate, wherein the second main surface is opposite to the first main surface;

a first wiring layer on the second main surface of the first semiconductor substrate;

a first electrode on a surface of the first wiring layer;

a second transistor on a surface of the second semiconductor substrate;

a second wiring layer on the surface of the second semiconductor substrate;

a second electrode on a surface of the second wiring layer; and a current reading wire that connects a third electrode of the at least one photodiode and a gate electrode of the second transistor through the first electrode and the second electrode, wherein the first electrode and the second electrode are joined, the first semiconductor substrate and the second semiconductor substrate are pasted together, and the distance of the gap is changed to acquire continuous optical spectra.

14. An electronic apparatus, comprising:

a sensor including at least one variable wavelength device and at least one photoelectric conversion element, wherein the at least one variable wavelength device includes:

an optical element configured to image an object, wherein the optical element includes:

a first optical interference filter;

a second optical interference filter that faces the first optical interference filter, wherein each of the first optical interference filter and the second optical interference filter is a multilayer film, a film thickness of a first layer of the multilayer film is different from a film thickness of a second layer of the multilayer film, and the first layer is adjacent to the second layer; and a gap between the first optical interference filter and the second optical interference filter; and a variable distance apparatus configured to change a distance of the gap based on a speed of movement of the object, wherein the distance of the gap is changed to acquire continuous optical spectra.

15. An electronic apparatus, comprising:

a solid-state imaging apparatus that comprises a plurality of pixels arranged one-dimensionally or two-dimensionally, wherein the plurality of pixels includes a sensor that includes:

at least one variable wavelength device including:

an optical element configured to image an object, wherein the optical element includes:

a first optical interference filter;

a second optical interference filter that faces the first optical interference filter, wherein each of the first optical interference filter and the second optical interference filter is a multilayer film, a film thickness of a first layer of the multilayer film is different from a film thickness of a second layer of the multilayer film, and the first layer is adjacent to the second layer; and a gap between the first optical interference filter and the second optical interference filter; and a variable distance apparatus configured to change a distance of the gap based on a speed of movement of the object; and at least one photoelectric conversion element, wherein the distance of the gap is changed to acquire continuous optical spectra.

* * * * *